United States Patent
Hall et al.

(10) Patent No.: US 8,658,245 B2
(45) Date of Patent: *Feb. 25, 2014

(54) SPIN COAT PROCESS FOR MANUFACTURING A Z-DIRECTED COMPONENT FOR A PRINTED CIRCUIT BOARD

(75) Inventors: Paul Kevin Hall, Lexington, KY (US); Keith Bryan Hardin, Lexington, KY (US); Zachary Charles Nathan Kratzer, Lexington, KY (US); Qing Zhang, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 31 days.

This patent is subject to a terminal disclaimer.

(21) Appl. No.: 13/222,276

(22) Filed: Aug. 31, 2011

(65) Prior Publication Data
US 2013/0048198 A1   Feb. 28, 2013

(51) Int. Cl.
*B05D 1/32* (2006.01)
*B05D 3/12* (2006.01)

(52) U.S. Cl.
USPC ........... 427/240; 427/258; 427/259; 427/261; 427/265; 427/282; 427/402; 427/425

(58) Field of Classification Search
USPC ......... 427/240, 425, 258, 259, 261, 265, 282, 427/402
See application file for complete search history.

(56) References Cited

U.S. PATENT DOCUMENTS

| | | | |
|---|---|---|---|
| 2,005,582 | A | 3/1934 | Given |
| 2,188,667 | A | 1/1940 | Stoekle et al. |
| 3,148,356 | A | 9/1964 | Hedden, Jr. |
| 3,219,886 | A | 11/1965 | Katzin et al. |
| 3,262,033 | A | 7/1966 | Culbertson |
| 3,377,611 | A | 4/1968 | Pawl et al. |
| 3,545,079 | A | 12/1970 | Kossar |

(Continued)

FOREIGN PATENT DOCUMENTS

| | | |
|---|---|---|
| EP | 202822 A2 | 11/1986 |
| GB | 1524388 A | 9/1978 |

(Continued)

OTHER PUBLICATIONS

International Search Report and Written Opinion of the International Searching Authority for PCT Application No. PCT/US12/52256 dated Nov. 16, 2012.

(Continued)

*Primary Examiner* — Kirsten Jolley
(74) *Attorney, Agent, or Firm* — Justin M Tromp

(57) ABSTRACT

A method for manufacturing a z-directed component for insertion into a mounting hole in a printed circuit board according to one example embodiment includes depositing a liquid based material onto a top surface of a rotatable plate. The top surface of the rotatable plate has at least one cavity formed thereon that defines the shape of a layer of the z-directed component. The rotatable plate is spun to level a top surface of the liquid based material in the at least one cavity. The liquid based material is cured to form the layer of the z-directed component. A conductive material is applied to at least one surface of the formed layer. The z-directed component is formed including a stack of component layers that includes the formed layer.

17 Claims, 19 Drawing Sheets

(56) References Cited

U.S. PATENT DOCUMENTS

| | | |
|---|---|---|
| 3,652,971 A | 3/1972 | Bugg |
| 3,666,160 A | 5/1972 | Gwyn, Jr. |
| 3,691,326 A | 9/1972 | Grossman et al. |
| 3,798,394 A | 3/1974 | Stokes |
| 3,996,440 A | 12/1976 | Niconienko |
| 4,109,295 A | 8/1978 | Rostek et al. |
| 4,109,296 A | 8/1978 | Rostek et al. |
| 4,199,209 A | 4/1980 | Cherian et al. |
| 4,381,134 A | 4/1983 | Anselmo et al. |
| 4,446,505 A | 5/1984 | Long et al. |
| 4,543,715 A | 10/1985 | Iadarola et al. |
| 4,561,486 A * | 12/1985 | Maeda et al. ............ 164/118 |
| 4,642,588 A | 2/1987 | Kameya |
| 4,654,472 A | 3/1987 | Goldfarb |
| 4,654,749 A | 3/1987 | Kanai |
| 4,675,625 A | 6/1987 | Johnston |
| 4,700,155 A | 10/1987 | Sakamoto et al. |
| 4,711,015 A | 12/1987 | Tega et al. |
| 4,735,753 A | 4/1988 | Ackerman |
| 4,775,326 A | 10/1988 | Lenaerts et al. |
| 4,789,346 A | 12/1988 | Frantz |
| 4,850,892 A | 7/1989 | Clayton et al. |
| 4,913,863 A | 4/1990 | Burrafato |
| 5,010,945 A | 4/1991 | Burke |
| 5,147,985 A | 9/1992 | DuBrucq |
| 5,166,096 A | 11/1992 | Cote et al. |
| 5,344,343 A | 9/1994 | Seidler |
| 5,406,444 A | 4/1995 | Selfried et al. |
| 5,603,847 A | 2/1997 | Howard et al. |
| 5,650,759 A | 7/1997 | Hittman et al. |
| 5,669,789 A | 9/1997 | Law |
| 5,708,569 A | 1/1998 | Howard et al. |
| 5,760,336 A | 6/1998 | Wang |
| 5,783,026 A | 7/1998 | Natarajan et al. |
| 5,851,865 A | 12/1998 | Koike |
| 5,858,145 A | 1/1999 | Sreeram et al. |
| 5,870,921 A | 2/1999 | Piccinin et al. |
| 5,952,723 A | 9/1999 | Takeyasu et al. |
| 6,045,615 A | 4/2000 | Buechele et al. |
| 6,054,649 A | 4/2000 | Uchida et al. |
| 6,068,782 A | 5/2000 | Brandt et al. |
| 6,153,290 A | 11/2000 | Sunahara |
| 6,165,864 A | 12/2000 | Shen et al. |
| 6,319,018 B1 | 11/2001 | Daoud |
| 6,329,715 B1 | 12/2001 | Hayashi |
| 6,388,208 B1 | 5/2002 | Kiani et al. |
| 6,593,535 B2 | 7/2003 | Gailus |
| 6,735,855 B2 | 5/2004 | Akram et al. |
| 6,754,551 B1 | 6/2004 | Zohar et al. |
| 6,870,252 B2 | 3/2005 | Novak et al. |
| 6,920,673 B2 | 7/2005 | Allen et al. |
| 6,948,943 B2 | 9/2005 | Li |
| 6,950,066 B2 | 9/2005 | Hendler et al. |
| 6,983,535 B2 | 1/2006 | Crockett et al. |
| 7,101,730 B2 | 9/2006 | Bolken et al. |
| 7,238,892 B2 | 7/2007 | Bois et al. |
| 7,416,985 B2 | 8/2008 | Yamamoto et al. |
| 7,458,151 B2 | 12/2008 | Onodera et al. |
| 7,486,498 B2 | 2/2009 | Welsch et al. |
| 7,509,856 B1 | 3/2009 | Winkens et al. |
| 7,525,814 B2 | 4/2009 | Yuri et al. |
| 7,599,191 B2 | 10/2009 | Shinaberger et al. |
| 7,663,064 B2 | 2/2010 | Dutta et al. |
| 7,820,479 B2 | 10/2010 | Sakaguchi |
| 7,843,056 B2 | 11/2010 | Smeys et al. |
| 7,888,599 B2 | 2/2011 | Kim et al. |
| 7,891,980 B2 | 2/2011 | Frasco |
| 7,969,745 B2 | 6/2011 | Hsu et al. |
| 8,035,951 B2 | 10/2011 | Wu et al. |
| 8,094,429 B2 | 1/2012 | Hsu et al. |
| 8,115,113 B2 | 2/2012 | Tanaka |
| 2001/0012036 A1 | 8/2001 | Giere et al. |
| 2002/0086188 A1 | 7/2002 | Halsey et al. |
| 2002/0117330 A1 | 8/2002 | Eldridge et al. |
| 2003/0081370 A1 | 5/2003 | Haskell et al. |
| 2003/0101585 A1 | 6/2003 | Pearson et al. |
| 2004/0121266 A1 | 6/2004 | Lee et al. |
| 2004/0224558 A1 | 11/2004 | Wan et al. |
| 2004/0242082 A1 | 12/2004 | Tsuchiya |
| 2005/0128680 A1 | 6/2005 | Shin et al. |
| 2005/0156319 A1 | 7/2005 | Oggioni et al. |
| 2006/0009038 A1 | 1/2006 | Cohen et al. |
| 2006/0054352 A1 | 3/2006 | Ryu et al. |
| 2006/0137907 A1 | 6/2006 | Chheda et al. |
| 2006/0145800 A1 | 7/2006 | Dadafshar et al. |
| 2006/0215380 A1 | 9/2006 | Lu et al. |
| 2006/0243581 A1 | 11/2006 | Nishimoto et al. |
| 2006/0266549 A1 | 11/2006 | Lin et al. |
| 2006/0278072 A1 | 12/2006 | Kent et al. |
| 2006/0286696 A1 | 12/2006 | Peiffer et al. |
| 2007/0051594 A1 | 3/2007 | Schwartz et al. |
| 2007/0085125 A1 | 4/2007 | Inoue et al. |
| 2007/0099513 A1 | 5/2007 | Savage et al. |
| 2007/0124930 A1 | 6/2007 | Cheng et al. |
| 2007/0138646 A1 | 6/2007 | Heston et al. |
| 2008/0013250 A1 | 1/2008 | Aoki |
| 2008/0047137 A1 | 2/2008 | Asahi et al. |
| 2008/0093336 A1 | 4/2008 | Lee et al. |
| 2008/0112109 A1 | 5/2008 | Muto et al. |
| 2008/0158770 A1 | 7/2008 | Lee et al. |
| 2008/0158851 A1 | 7/2008 | Cochrane |
| 2008/0169125 A1 | 7/2008 | Hsu et al. |
| 2008/0202799 A1 | 8/2008 | Graydon et al. |
| 2008/0223603 A1 | 9/2008 | Kim et al. |
| 2008/0236876 A1 | 10/2008 | Kodama et al. |
| 2008/0315024 A1 | 12/2008 | Gallagher |
| 2008/0318410 A1 | 12/2008 | Hwang |
| 2009/0046441 A1 | 2/2009 | Funaya et al. |
| 2009/0097218 A1 | 4/2009 | Miyamoto |
| 2009/0114421 A1 | 5/2009 | Swift et al. |
| 2009/0154872 A1 | 6/2009 | Sherrer et al. |
| 2009/0175012 A1 | 7/2009 | Frasco |
| 2009/0219667 A1 | 9/2009 | Eriksson |
| 2010/0026440 A1 | 2/2010 | Lim et al. |
| 2010/0059266 A1 | 3/2010 | Yoo et al. |
| 2010/0124035 A1 | 5/2010 | Bandholz et al. |
| 2010/0208440 A1 | 8/2010 | Peiffer et al. |
| 2010/0230806 A1 | 9/2010 | Huang et al. |
| 2010/0237495 A1 | 9/2010 | Pagaila et al. |
| 2010/0326843 A1 | 12/2010 | Zhang et al. |
| 2011/0017502 A1 | 1/2011 | Hardin et al. |
| 2011/0017503 A1 | 1/2011 | Hardin et al. |
| 2011/0017504 A1 | 1/2011 | Hardin et al. |
| 2011/0017505 A1 | 1/2011 | Hardin et al. |
| 2011/0017507 A1 | 1/2011 | Hardin et al. |
| 2011/0017581 A1 | 1/2011 | Hardin et al. |
| 2011/0019374 A1 | 1/2011 | Hardin et al. |
| 2011/0019375 A1 | 1/2011 | Hardin et al. |
| 2011/0019376 A1 | 1/2011 | Hardin et al. |
| 2011/0037155 A1 | 2/2011 | Pagaila |

FOREIGN PATENT DOCUMENTS

| | | |
|---|---|---|
| JP | 2002-316084 A | 10/2002 |
| WO | 8001146 A1 | 6/1980 |
| WO | 8301923 A1 | 6/1983 |
| WO | 2006121818 A2 | 11/2006 |

OTHER PUBLICATIONS

International Search Report and Written Opinion of the International Searching Authority for PCT Application No. PCT/US12/52258 dated Nov. 16, 2012.

International Search Report and Written Opinion of the International Searching Authority for PCT Application No. PCT/US12/52262 dated Jan. 10, 2013.

International Search Report and Written Opinion of the International Searching Authority for PCT Application No. PCT/US12/56840 dated Jan. 11, 2013.

International Search Report and Written Opinion of the International Searching Authority for PCT Application No. PCT/US12/61251 dated Jan. 25, 2013.

Copending U.S. Appl. No. 13/433,340, filed Mar. 29, 2012.

(56) References Cited

OTHER PUBLICATIONS

Copending U.S. Appl. No. 13/433,349, filed Mar. 29, 2012.
Copending U.S. Appl. No. 13/433,355, filed Mar. 29, 2012.
Copending U.S. Appl. No. 13/433,364, filed Mar. 29, 2012.
Copending U.S. Appl. No. 13/433,369, filed Mar. 29, 2012.
Copending U.S. Appl. No. 13/349,822, filed Jan. 13, 2012.
Copending U.S. Appl. No. 13/448,460, filed Apr. 17, 2012.
U.S. Appl. No. 13/528,097, filed Jun. 20, 2012.
U.S. Appl. No. 13/528,129, filed Jun. 20, 2012.
"IPC Standards—The Evolution of Embedded Components Standards"; IPC Review Mar./Apr. 2009; p. 14; vol. 2; IPC, Inc., Bannockburn, Illinois, USA (1 page).
2010 Spectrum Advanced Specialty Products Catalog; relevant pp. AC2-AC12; Spectrum Advanced Specialty Products; Fairview, Pennsylvania, USA (21 pages).
International Searching Authority, International Search Report and Written Opinion for PCT/US2011/022005, Mar. 18, 2011 (6 pages).
International Searching Authority, International Search Report and Written Opinion for PCT/US2011/022008, Mar. 29, 2011 (6 pages).
International Searching Authority, International Search Report and Written Opinion for PCT/US2011/022012, Apr. 11, 2011 (7 pages).
International Searching Authority, International Search Report and Written Opinion for PCT/US2011/022019, Mar. 23, 2011 (8 pages).
International Searching Authority, International Search Report and Written Opinion for PCT/US2011/022021, Mar. 28, 2011 (6 pages).
International Searching Authority, International Search Report and Written Opinion for PCT/US2011/022022, Mar. 28, 2011 (6 pages).
International Searching Authority, International Search Report and Written Opinion for PCT/US2011/022027, May 2, 2011 (7 pages).
International Searching Authority, International Search Report and Written Opinion for PCT/US2011/022028, Apr. 1, 2011 (9 pages).
International Searching Authority, International Search Report and Written Opinion for PCT/US2011/022036, Apr. 1, 2011 (6 pages).
Copending U.S. Appl. No. 13/222,748, filed Aug. 31, 2011.
Copending U.S. Appl. No. 13/222,418, filed Aug. 31, 2011.
Copending U.S. Appl. No. 13/250,812, filed Sep. 30, 2011.
Copending U.S. Appl. No. 13/284,084, filed Oct. 28, 2011.
Prosecution history of copending U.S. Appl. No. 12/508,145 including Ex Parte Quayle Action dated Feb. 2, 2012.
Albertsen et al., "Combined Manufacture Methods for High Density LTCC Substrates: Thick Film Screen Printing, Ink Jet, Postfiring Thin Film Processes, and Laser-Drilled Fine Vias," Journal of Microelectronics and Electronic Packaging vol. 6, No. 1, 1st Qtr. 2009.
Prosecution history of copending U.S. Appl. No. 13/222,748 including Non-Final Office Action dated Jul. 18, 2013.
International Search Report and Written Opinion of the International Searching Authority for PCT Application No. PCT/US13/46466 dated Oct. 16, 2013.
International Search Report and Written Opinion of the International Searching Authority for PCT Application No. PCT/US13/46467 dated Nov. 14, 2013.

\* cited by examiner

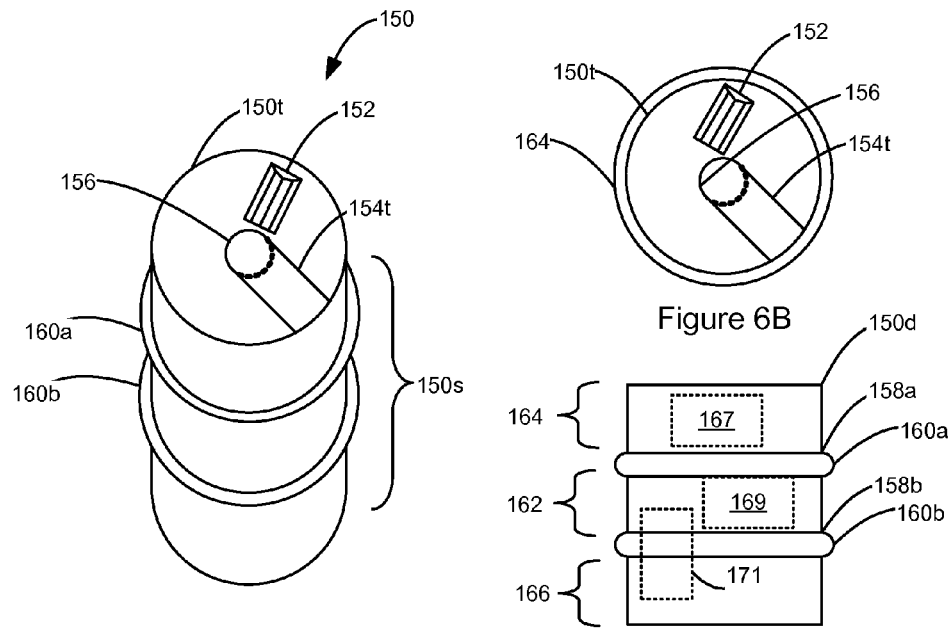
Figure 6A
Figure 6B
Figure 6C
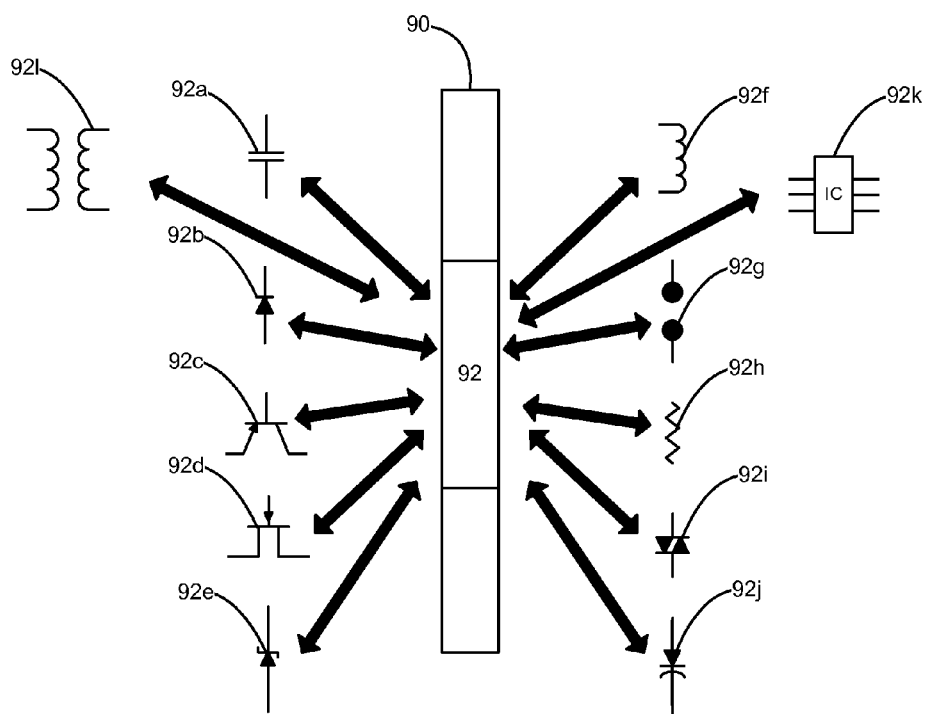
Figure 7

SPIN COAT PROCESS FOR MANUFACTURING A Z-DIRECTED COMPONENT FOR A PRINTED CIRCUIT BOARD

CROSS REFERENCES TO RELATED APPLICATIONS

This patent application is related to U.S. patent application Ser. No. 13/222,748, filed Aug. 31, 2011, entitled "Die Press Process for Manufacturing a Z-Directed Component for a Printed Circuit Board," U.S. patent application Ser. No. 13/222,418, filed Aug. 31, 2011, entitled "Screening Process for Manufacturing a Z-Directed Component for a Printed Circuit Board," U.S. patent application Ser. No. 13/250,812, filed Sep. 30, 2011, entitled "Extrusion Process for Manufacturing a Z-Directed Component for a Printed Circuit Board," and U.S. patent application Ser. No. 13/284,084, filed Oct. 28, 2011, entitled "Continuous Extrusion Process for Manufacturing a Z-Directed Component for a Printed Circuit Board," which are assigned to the assignee of the present application.

BACKGROUND

1. Field of the Disclosure

The present invention relates generally to processes for manufacturing printed circuit board components and more particularly to a spin coat process for manufacturing a Z-directed component for a printed circuit board.

2. Description of the Related Art

The following co-pending United States patent applications, which are assigned to the assignee of the present application, describe various "Z-directed" components that are intended to be embedded or inserted into a printed circuit board ("PCB"): Ser. No. 12/508,131 entitled "Z-Directed Components for Printed Circuit Boards," Serial No. 12/508,145 entitled "Z-Directed Pass-Through Components for Printed Circuit Boards," Ser. No. 12/508,158 entitled "Z-Directed Capacitor Components for Printed Circuit Boards," Ser. No. 12/508,188 entitled "Z-Directed Delay Line Components for Printed Circuit Boards," Ser. No. 12/508,199 entitled "Z-Directed Filter Components for Printed Circuit Boards," Ser. No. 12/508,204 entitled "Z-Directed Ferrite Bead Components for Printed Circuit Boards," Ser. No. 12/508,215 entitled "Z-Directed Switch Components for Printed Circuit Boards," Ser. No. 12/508,236 entitled "Z-Directed Connector Components for Printed Circuit Boards," and Ser. No. 12/508,248 entitled "Z-Directed Variable Value Components for Printed Circuit Boards."

As densities of components for printed circuit boards have increased and higher frequencies of operation are used, some circuits' designs have become very difficult to achieve. The Z-directed components described in the foregoing patent applications are designed to improve the component densities and frequencies of operation. The Z-directed components occupy less space on the surface of a PCB and for high frequency circuits, e.g. clock rates greater than 1 GHz, allow for higher frequency of operation. The foregoing patent applications describe various types of Z-directed components including, but not limited to, capacitors, delay lines, transistors, switches, and connectors. A process that permits mass production of these components on a commercial scale is desired.

SUMMARY

A method for manufacturing a z-directed component for insertion into a mounting hole in a printed circuit board according to one example embodiment includes depositing a liquid based material onto a top surface of a rotatable plate. The top surface of the rotatable plate has at least one cavity formed thereon that defines the shape of a layer of the z-directed component. The rotatable plate is spun to level a top surface of the liquid based material in the at least one cavity. The liquid based material is cured to form the layer of the z-directed component. A conductive material is applied to at least one surface of the formed layer. The z-directed component is formed including a stack of component layers that includes the formed layer.

A method for manufacturing a z-directed component for insertion into a mounting hole in a printed circuit board according to another example embodiment includes depositing a liquid based material onto a top surface of a rotatable plate. The rotatable plate has a first cavity portion formed thereon that defines the shape of a first layer of the z-directed component. The rotatable plate is spun to level a top surface of the liquid based material in the first cavity portion. The liquid based material is cured to form the first layer of the z-directed component. A conductive material is applied to at least one surface of the first formed layer. A second cavity portion is formed on top of the first cavity portion that defines the shape of a second layer of the z-directed component. Additional liquid based material is deposited onto the top surface of the rotatable plate. The rotatable plate is spun to level a top surface of the liquid based material in the second cavity portion. The liquid based material is cured to form the second layer of the z-directed component stacked on top of the first layer. The z-directed component is formed including a stack of component layers that includes the first and second layers.

BRIEF DESCRIPTION OF THE DRAWINGS

The above-mentioned and other features and advantages of the various embodiments, and the manner of attaining them, will become more apparent and will be better understood by reference to the accompanying drawings.

FIG. 6A is a perspective view of a Z-directed component having O-rings for connecting to internal layers of a PCB and having a body having regions comprised of similar and/or dissimilar materials according to one example embodiment.

FIG. 6B is a top plan view of the Z-directed component shown in FIG. 6A.

FIG. 6C is a schematic side elevation view of the Z-directed component shown in FIG. 6A.

FIG. 7 is a schematic illustration of various example elements or electronic components that may be provided within the body of a Z-directed component in series with a conductive channel.

DETAILED DESCRIPTION

Figure 1:
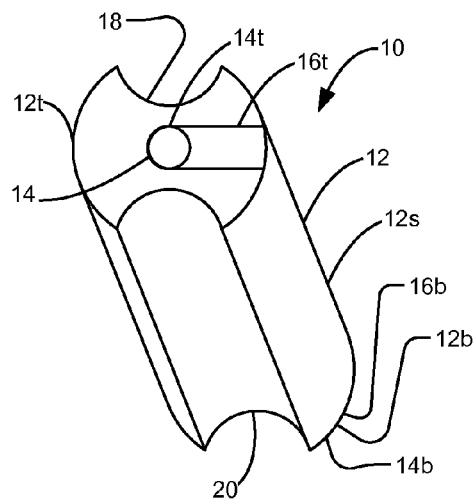
FIG. 1 is a perspective view of a Z-directed component according to one example embodiment.

The following description and drawings illustrate embodiments sufficiently to enable those skilled in the art to practice the present invention. It is to be understood that the disclosure is not limited to the details of construction and the arrangement of components set forth in the following description or illustrated in the drawings. The invention is capable of other embodiments and of being practiced or of being carried out in various ways. For example, other embodiments may incorporate structural, chronological, electrical, process, and other changes. Examples merely typify possible variations. Individual components and functions are optional unless explicitly required, and the sequence of operations may vary. Portions and features of some embodiments may be included in or substituted for those of others. The scope of the application encompasses the appended claims and all available equivalents. The following description is, therefore, not to be taken in a limited sense and the scope of the present invention is defined by the appended claims.

Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings. In addition, the terms "connected" and "coupled" and variations thereof are not restricted to physical or mechanical connections or couplings.

Overview of Z-Directed Components

An X-Y-Z frame of reference is used herein. The X and Y axes describe the plane defined by the face of a printed circuit board. The Z-axis describes a direction perpendicular to the plane of the circuit board. The top surface of the PCB has a zero Z-value. A component with a negative Z-direction value indicates that the component is inserted into the top surface of the PCB. Such a component may be above (extend past), flush with, or recessed below either the top surface and/or the bottom surface of the PCB. A component having both a positive and negative Z-direction value indicates that the component is partially inserted into the surface of the PCB. The Z-directed components are intended to be inserted into a hole or recess in a printed circuit board. Depending on the shape and length of the component(s), more than one Z-directed component may be inserted into a single mounting hole in the PCB, such as being stacked together or positioned side by side. The hole may be a through hole (a hole from the top surface through to the bottom surface), a blind hole (an opening or recess through either the top or bottom surface into an interior portion or internal layer of the PCB) or an internal cavity such that the Z-directed component is embedded within the PCB.

For a PCB having conductive traces on both external layers, one external layer is termed the top surface and the other the bottom surface. Where only one external layer has conductive traces, that external surface is referred to as the top surface. The Z-directed component is referred to as having a top surface, a bottom surface and a side surface. The references to top and bottom surfaces of the Z-directed component conform to the convention used to refer to the top and bottom surfaces of the PCB. The side surface of a Z-directed component extends between the top and bottom surfaces of the PCB and would be adjacent to the wall of the mounting hole in the PCB where the mounting hole is perpendicular to the face of the PCB. This use of top, bottom and side should not be taken as limiting how a Z-directed component may be mounted into a PCB. Although the components are described herein as being mounted in a Z-direction, this does not mean that such components are limited to being inserted into a PCB only along the Z-axis. Z-directed components may be mounted normal to the plane of the PCB from the top or bottom surfaces or both surfaces, mounted at an angle thereto or, depending on the thickness of the PCB and the dimensions of the Z-directed component, inserted into the edge of the PCB between the top and bottom surfaces of the PCB. Further, the Z-directed components may be inserted into the edge of the PCB even if the Z-directed component is wider than the PCB is tall as long as the Z-directed component is held in place.

The Z-directed components may be made from various combinations of materials commonly used in electronic components. The signal connection paths are made from conductors, which are materials that have high conductivity. Unless otherwise stated, reference to conductivity herein refers to electrical conductivity. Conducting materials include, but are not limited to, copper, gold, aluminum, silver, tin, lead and many others. The Z-directed components may have areas that need to be insulated from other areas by using insulator materials that have low conductivity like plastic, glass, FR4 (epoxy & fiberglass), air, mica, ceramic and others. Capacitors are typically made of two conducting plates separated by an insulator material that has a high permittivity (dielectric constant). Permittivity is a parameter that shows the ability to store electric fields in the materials like ceramic, mica, tantalum and others. A Z-directed component that is constructed as a resistor requires materials that have properties that are between a conductor and insulator having a finite amount of resistivity, which is the reciprocal of conductivity. Materials like carbon, doped semiconductor, nichrome, tin-oxide and others are used for their resistive properties. Inductors are typically made of coils of wires or conductors wrapped around a material with high permeability. Permeability is a parameter that shows the ability to store magnetic fields in the material which may include iron and alloys like nickel-zinc, manganese-zinc, nickel-iron and others. Transistors such as field effect transistors ("FETs") are electronic devices that are made from semiconductors that behave in a nonlinear fashion and are made from silicon, germanium, gallium arsenide and others.

Throughout the application there are references that discuss different materials, properties of materials or terminology interchangeably as currently used in the art of material science and electrical component design. Because of the flexibility in how a Z-directed component may be employed and the number of materials that may be used, it is also contemplated that Z-directed components may be constructed of materials that have not been discovered or created to date. The body of a Z-directed component will in general be comprised of an insulator material unless otherwise called out in the description for a particular design of a Z-directed component. This material may possess a desired permittivity, e.g., the body of a capacitor will typically be comprised of an insulator material having a relatively high dielectric constant.

PCBs using a Z-directed component may be constructed to have a single conductive layer or multiple conductive layers as is known. The PCB may have conductive traces on the top surface only, on the bottom surface only, or on both the top and bottom surfaces. In addition, one or more intermediate internal conductive trace layers may also be present in the PCB.

Connections between a Z-directed component and the traces in or on a PCB may be accomplished by soldering techniques, screening techniques, extruding techniques or plating techniques known in the art. Depending on the application, solder pastes and conductive adhesives may be used. In some configurations, compressive conductive members may be used to interconnect a Z-directed component to conductive traces found on the PCB.

The most general form of a Z-directed component comprises a body having a top surface, a bottom surface and a side surface, a cross-sectional shape that is insertable into a mounting hole of a given depth D within a PCB with a portion of the body comprising an insulator material. All of the embodiments described herein for Z-directed components are based on this general form.

Figure 2:
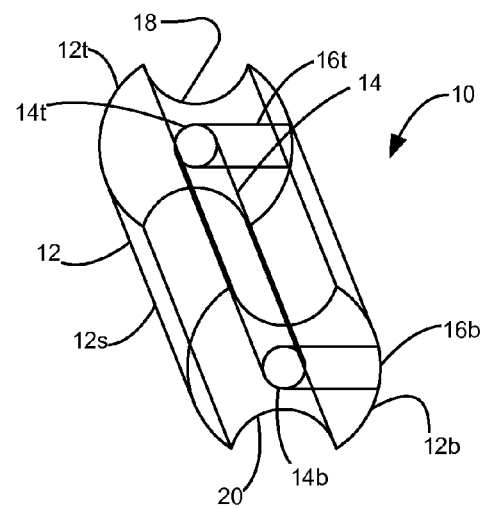
FIG. 2 is a transparent perspective view of the Z-directed component shown in FIG. 1 illustrating the internal arrangement of elements of the Z-directed component.

FIGS. 1 and 2 show an embodiment of a Z-directed component. In this embodiment, Z-directed component 10 includes a generally cylindrical body 12 having a top surface 12t, a bottom surface 12b, a side surface 12s, and a length L generally corresponding to the depth D of the mounting hole. The length L can be less than, equal to or greater than the depth D. In the former two cases, Z-directed component 10 would in one case be below at least one of the top and bottom surfaces of the PCB and in the other it may be flush with the two surfaces of the PCB. Where length L is greater than depth D, Z-directed component 10 would not be flush mounted with at least one of the top and bottom surfaces of the PCB. However, with this non-flush mount, Z-directed component 10 would be capable of being used to interconnect to another component or another PCB that is positioned nearby. The mounting hole is typically a through-hole extending between the top and bottom surfaces of the PCB but it may also be a blind hole. When recessed below the surface of the PCB, additional resist areas may be required in the hole of the PCB to keep from plating the entire circumferential area around the hole.

Z-directed component 10 in one form may have at least one conductive channel 14 extending through the length of body 12. At the top and bottom ends 14t and 14b of conductive channel 14, top and bottom conductive traces 16t, 16b are provided on the top and bottom end surfaces 12t, 12b of body 12 and extend from respective ends of the conductive channel 14 to the edge of Z-directed component 10. In this embodiment, body 12 comprises an insulator material. Depending on its function, body 12 of Z-directed component 10 may be made of variety of materials having different properties. These properties include being conductive, resistive, magnetic, dielectric, or semi-conductive or various combinations of properties as described herein. Examples of materials that have the properties are copper, carbon, iron, ceramic or silicon, respectively. Body 12 of Z-directed component 10 may also comprise a number of different networks needed to operate a circuit that will be discussed later.

One or more longitudinally extending channels or wells may be provided on the side surface of body 12 of Z-directed component 10. The channel may extend from one of the top surface and the bottom surface of body 12 toward the opposite surface. As illustrated, two concave side wells or channels 18 and 20 are provided in the outer surface of Z-directed component 10 extending the length of body 12. When plated or soldered, these channels allow electrical connections to be made to Z-directed component 10, through the PCB, as well as to internal conductive layers within the PCB. The length of side channels 18 or 20 may extend less than the entire length of body 12.

FIG. 2 shows the same component as in FIG. 1 but with all the surfaces transparent. Conductive channel 14 is shown as a cylinder extending through the center of Z-directed component 10. Other shapes may also be used for conductive channel 14. Traces 16t and 16b can be seen extending from ends 14t and 14b of conductive channel 14, respectively, to the edge of body 12. While traces 16t and 16b are shown as being in alignment with one another (zero degrees apart), this is not a requirement and they may be positioned as needed for a particular design. For example, traces 16t and 16b may be 180 degrees apart or 90 degrees apart or any other increment.

Figure 3A:
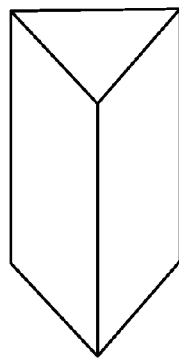
FIGS. 3A-3F are perspective views showing various example shapes for the body of a Z-directed component.
Figure 3B:
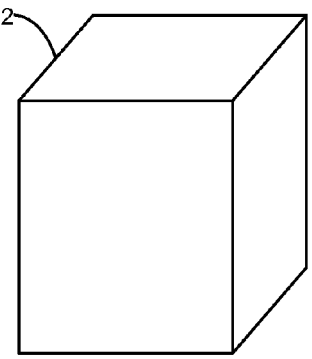
Figure 3C:
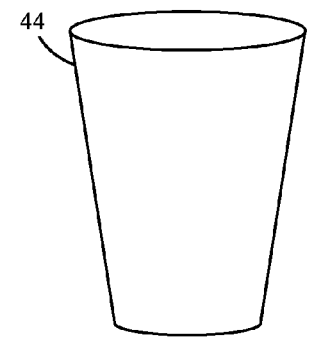
Figure 3D:
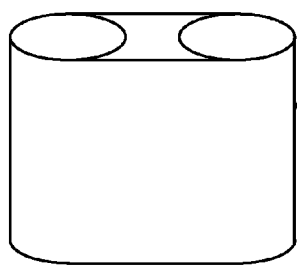
Figure 3E:
Figure 3F:
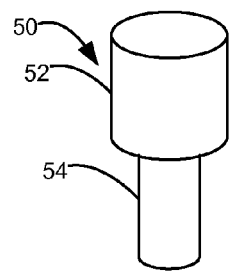

The shape of the body of the Z-directed component may be any shape that can fit into a mounting hole in a PCB. FIGS. 3A-3F illustrate possible body shapes for a Z-directed component. FIG. 3A shows a triangular cross-sectional body 40; FIG. 3B shows a rectangular cross-sectional body 42; FIG. 3C shows a frusto-conical body 44; FIG. 3D shows an ovate cross-sectional cylindrical body 46; and FIG. 3E shows a cylindrical body 48. FIG. 3F shows a stepped cylindrical body 50 where one portion 52 has a larger diameter than another portion 54. With this arrangement, the Z-directed component may be mounted on the surface of the PCB while having a section inserted into a mounting hole provided in the PCB. The edges of the Z-directed component may be beveled to help with aligning the Z-directed component for insertion into a mounting hole in a PCB. Other shapes and combinations of those illustrated may also be used for a Z-directed component as desired.

Figures 4A, 4B, 4C:
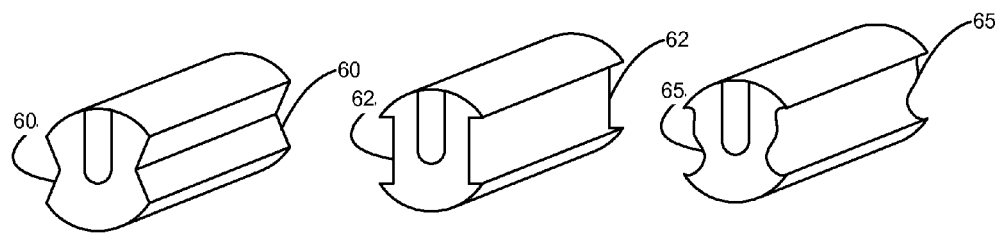
FIGS. 4A-4C are perspective views showing various example side channel configurations for a Z-directed component.

For a Z-directed component, the channels for plating can be of various cross-sectional shapes and lengths. The only requirement is that plating or solder material make the proper connections to the Z-directed component and corresponding conductive traces in or on the PCB. Side channels 18 or 20 may have, for example, V-, C- or U-shaped cross-sections, semi-circular or elliptical cross-sections. Where more than one channel is provided, each channel may have the same or a different cross-sectional shape. FIGS. 4A-4C illustrate three side channel shapes. In FIG. 4A, V-shaped side channels 60 are shown. In FIG. 4B, U- or C-shaped side channels 62 are shown. In FIG. 4C, wavy or irregular cross-sectional side channel shapes 65 are shown.

The numbers of layers in a PCB varies from being single sided to being over 22 layers and may have different overall thicknesses that range from less than 0.051 inch to over 0.093 inch or more. Where a flush mount is desired, the length of the Z-directed component will depend on the thickness of the PCB into which it is intended to be inserted. The Z-directed component's length may also vary depending on the intended function and tolerance of a process. The preferred lengths will be where the Z-directed component is either flush with the surfaces or extends slightly beyond the surface of the PCB. This would keep the plating solution from plating completely around the interior of the PCB hole that may cause a short in some cases. It is possible to add a resist material around the interior of a PCB hole to only allow plating in the desired areas. However, there are some cases where it is desired to completely plate around the interior of a PCB hole above and below the Z-directed component. For example, if the top layer of the PCB is a $V_{CC}$ plane and the bottom layer is a GND plane then a decoupling capacitor would have lower impedance if the connection used a greater volume of copper to make the connection.

There are a number of features that can be added to a Z-directed component to create different mechanical and electrical characteristics. The number of channels or conductors can be varied from zero to any number that can maintain enough strength to take the stresses of insertion, plating, manufacturing processes and operation of the PCB in its intended environment. The outer surface of a Z-directed component may have a coating that glues it in place. Flanges or radial projections may also be used to prevent over or under insertion of a Z-directed component into the mounting hole, particularly where the mounting hole is a through-hole. A surface coating material may also be used to promote or impede migration of the plating or solder material. Various locating or orienting features may be provided such as a recess or projection, or a visual or magnetic indicator on an end surface of the Z-directed component. Further, a connecting feature such as a conductive pad, a spring loaded style pogo-pin or even a simple spring may be included to add an additional electrical connection (such as frame ground) point to a PCB.

Figures 5A, 5B, 5C, 5D:
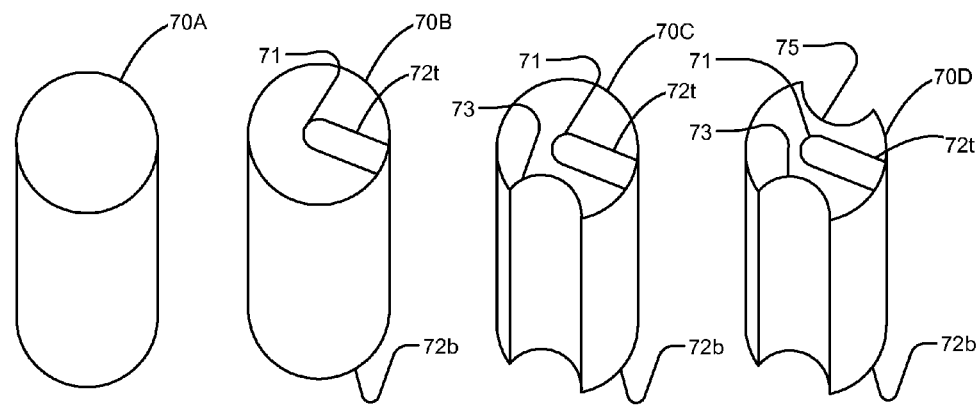
FIGS. 5A-5H are perspective views showing various example channel configurations for the body of a Z-directed component.
Figures 5E, 5F, 5G, 5H:
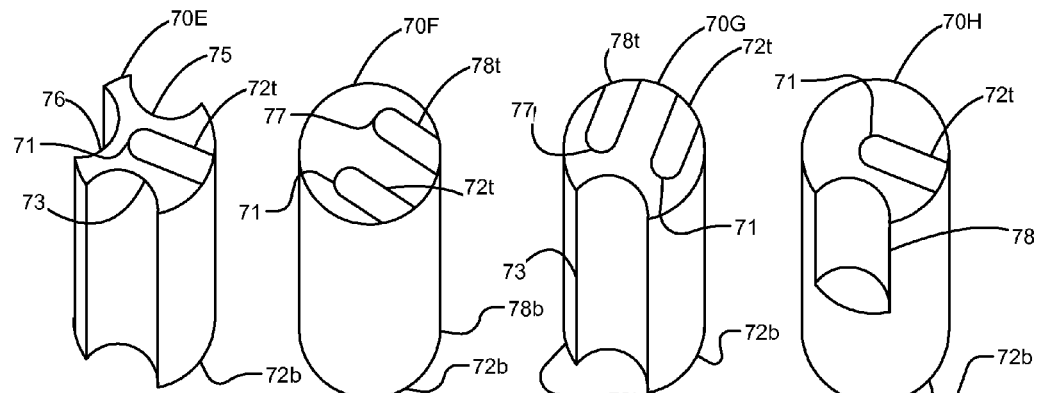

A Z-directed component may take on several roles depending on the number of ports or terminals needed to make connections to the PCB. Some possibilities are shown in FIGS. 5A-H. FIG. 5A is a Z-directed component configured as 0-port device 70A used as a plug so that if a filter or a component is optional then the plug stops the hole from being plated. After the PCB has been manufactured, the 0-port device 70A may be removed and another Z-directed component may be inserted, plated and connected to the circuit. FIGS. 5B-5H illustrate various configurations useful for multi-terminal devices such as resistors, diodes, transistors, and/or clock circuits. FIG. 5B shows a 1-port or single signal Z-directed component 70B having a conductive channel 71 through a center portion of the component connected to top and bottom conductive traces 72t, 72b. FIG. 5C shows a 1-port 1-channel Z-directed component 70C where one plated side well or channel 73 is provided in addition to conductive channel 71 through the component, which is connected to top and bottom conductive traces 72t and 72b. FIG. 5D shows a Z-directed component 70D having two side wells 73 and 75 in addition to conductive channel 71 through the component which is connected to top and bottom traces 72t, 72b. The Z-directed component 70E of FIG. 5E has three side wells 73, 75 and 76 in addition to conductive channel 71 through the component, which is connected to top and bottom traces 72t, 72b. FIG. 5F shows Z-directed component 70F having two conductive channels 71 and 77 through the component each with their respective top and bottom traces 72t, 72b and 78t, 78b and no side channels or wells. Z-directed component 70F is a two signal device to be primarily used for differential signaling. FIG. 5G shows a Z-directed component 70G having one side well 73 and two conductive channels 71 and 77 each with their respective top and bottom traces 72t, 72b and 78t, 78b. FIG. 5H shows Z-directed component 70H having one conductive channel 71 with top and bottom traces 72t, 72b and a blind well or partial well 78 extending from the top surface along a portion of the side surface that will allow the plating material or solder to stop at a given depth. For one skilled in the art, the number of wells and signals is only limited by the space, required well or channel sizes.

FIGS. 6A-C illustrate another configuration for a Z-directed component utilizing O-rings for use in a PCB having a top and bottom conductive layer and at least one internal conductive layer. Z-directed component 150 is shown having on its top surface 150t, a locating feature 152 and a conductive top trace 154t extending between a conductive channel 156 and the edge of body 150d on its top surface 150t. A conductive bottom trace (not shown) is provided on the bottom surface. Conductive channel 156 extends through a portion of the body 150*d* as previously described. Located on the side surface 150*s* of body 150*d* is a least one semi-circular channel or grove. As shown, a pair of axially spaced apart circumferential channels 158*a*, 158*b* is provided having O-rings 160*a*, 160*b*, respectively disposed within channels 158*a*, 158*b*. A portion of the O-rings 160*a*, 160*b* extend out beyond the side surface 150*s* of the body 150*d*. O-rings 160*a*, 160*b* would be positioned adjacent one or more of the internal layers of the PCB to make electrical contract to one or more traces provided at that point in the mounting hole for the Z-directed component. Depending on the design employed, an O-ring would not have to be provided adjacent every internal layer.

O-rings 160*a*, 160*b* may be conductive or non-conductive depending on the design of the circuit in which they are used. O-rings 160*a*, 160*b* preferably would be compressive helping to secure Z-directed component 150 within the mounting hole. The region 162 of body 150*d* intermediate O-rings 160*a*, 160*b* may be comprised of different material than the regions 164 and 166 of the body 150*d* outside of the O-rings. For example, if the material of region 162 is of a resistive material and O-rings 160*a*, 160*b* are conductive then internal circuit board traces in contact with the O-rings 160*a*, 160*b* see a resistive load.

Regions 164 and 166 may also be comprised of a material having different properties from each other and region 162. For example, region 164 may be resistive, region 162 capacitive and region 166 inductive. Each of these regions can be electrically connected to the adjoining layers of the PCB. Further, conductive channel 156 and traces 154*t*, 154*b* do not need to be provided. So for the illustrated construction, between the top layer of the PCB and the first internal layer from the top, a resistive element may be present in region 164, a capacitive element between the first internal layer and the second internal layer in region 162 and an inductive element between the second internal layer and the bottom layer of the PCB in region 166. Accordingly, for a signal transmitted from an internal trace contacting conductive O-ring 160*a* to a second internal trace contacting conductive O-ring 160*b*, the signal would see an inductive load. The material for regions 162, 164, 166 may have properties selected from a group comprising conductive, resistive, magnetic, dielectric, capacitive or semi-conductive and combinations thereof. The design may be extended to circuit boards having fewer or more internal layers than that described without departing from the spirit of the invention.

In addition, regions 162, 164, 166 may have electronic components 167, 169, 171 embedded therein and connected as described herein. Also, as illustrated for component 171, a component may be found within one or more regions within the body of a Z-directed component. Internal connections may be provided from embedded components to O-rings 160*a*, 160*b*. Alternatively, internal connections may be provided from the embedded components to plateable pads provided on the side surface 150*s*.

The various embodiments and features discussed for a Z-directed component are meant to be illustrative and not limiting. A Z-directed component may be made of a bulk material that performs a network function or may have other parts embedded into its body. A Z-directed component may be a multi-terminal device and, therefore, may be used to perform a variety of functions including, but not limited to: transmission lines, delay lines, T filters, decoupling capacitors, inductors, common mode chokes, resistors, differential pair pass throughs, differential ferrite beads, diodes, or ESD protection devices (varistors). Combinations of these functions may be provided within one component.

FIG. 7 illustrates various example configurations for a conductive channel in a Z-directed component. As shown, channel 90 has a region 92 intermediate the ends comprising a material having properties selected from a group comprising conductive, resistive, magnetic, dielectric, capacitive or semi-conductive properties and combinations thereof. These materials form a variety of components. Additionally, a component may be inserted or embedded into region 92 with portions of the conductive channel extending from the terminals of the component. A capacitor 92*a* may be provided in region 92. Similarly, a diode 92*b*, a transistor 92*c* such as a MOSFET 92*d*, a zener diode 92*e*, an inductor 92*f*, a surge suppressor 92*g*, a resistor 92*h*, a diac 92*i*, a varactor 92*j* and combinations of these items are further examples of materials that may be provided in region 92 of conductive channel 90. While region 92 is shown as being centered within the conductive channel 90, it is not limited to that location.

For a multi-terminal device such as transistor 92*c*, MOSFET 92*d*, an integrated circuit 92*k*, or a transformer 921, one portion of the conductive channel may be between the top surface trace and a first terminal of the device and the other portion of the conductive channel between the bottom surface trace and a second terminal of the device. For additional device terminals, additional conductors may be provided in the body of the Z-directed component to allow electrical connection to the remaining terminals or additional conductive traces may be provided within the body of the Z-directed component between the additional terminals and channels on the side surface of the body of a Z-directed component allowing electrical connection to an external conductive trace. Various connection configurations to a multiple terminal device may be used in a Z-directed component.

Accordingly, those skilled in the art will appreciate that various types of Z-directed components may be utilized including, but not limited to, capacitors, delay lines, transistors, switches, and connectors. For example, FIGS. 8 and 9 illustrate a Z-directed component termed a signal pass-through that is used for passing a signal trace from the top surface of a PCB to the bottom surface.

Z-Directed Signal Pass-Through Component

Figure 8:
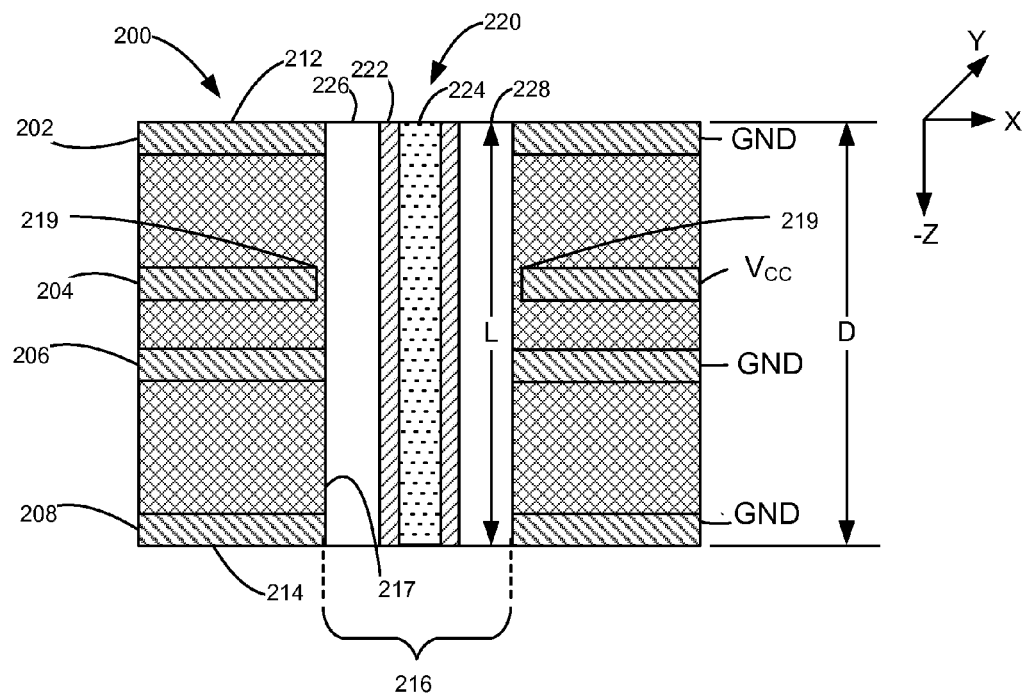
FIG. 8 is a schematic cross-sectional view of a Z-directed component flush mounted in a PCB showing conductive traces and connections to the Z-directed component according to one example embodiment.
Figure 9:
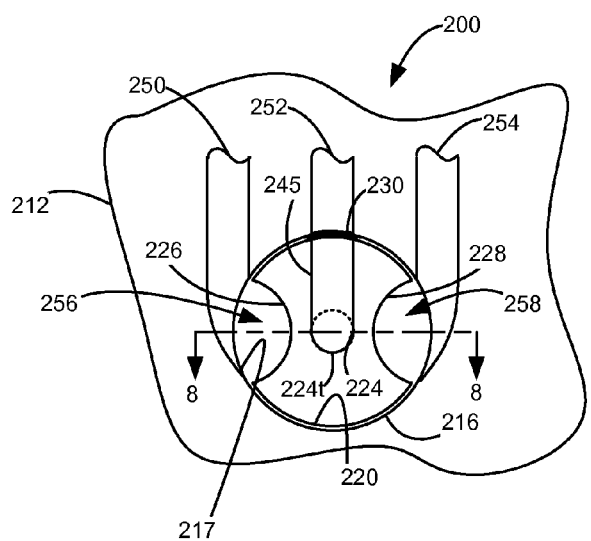
FIG. 9 is a top plan view of the Z-directed component and PCB shown in FIG. 8.

FIG. 8 shows a sectional view taken along line 8-8 in FIG. 9 of a PCB 200 having 4 conductive planes or layers comprising, from top to bottom, a ground (GND) plane or trace 202, a voltage supply plane $V_{CC}$ 204, a second ground GND plane 206 and a third ground GND plane or trace 208 separated by nonconductive material such as a phenolic plastic such as FR4 which is widely used as is known in the art. PCB 200 may be used for high frequency signals. The top and bottom ground planes or traces 202 and 208, respectively, on the top and bottom surfaces 212 and 214, respectively, of PCB 200 are connected to conductive traces leading up to Z-directed component 220. A mounting hole 216 having a depth D in a negative Z direction is provided in PCB 200 for the flush mounting of Z-directed component 220. Here depth D corresponds to the thickness of PCB 200; however, depth D may be less than the thickness of PCB 200 creating a blind hole therein. Mounting hole 216, as illustrated, is a through-hole that is round in cross-section to accommodate Z-directed component 220 but may have cross sections to accommodate the insertion of Z-directed components having other body configurations. In other words, mounting holes are sized so that Z-directed components are insertable therein. For example, a Z-directed component having a cylindrical shape may be inserted into a square mounting hole and vice versa. In the cases where Z-directed component does not make a tight fit, resist materials will have to be added to the areas of the component and PCB where copper plating is not desired.

Z-directed component 220 is illustrated as a three lead component that is flush mounted with respect to both the top surface 212 and bottom surface 214 of PCB 200. Z-directed component 220 is illustrated as having a generally cylindrical body 222 of a length L. A center conductive channel or lead 224, illustrated as being cylindrical, is shown extending the length of body 222. Two concave side wells or channels 226 and 228, which define the other two leads, are provided on the side surface of Z-directed component 220 extending the length of body 222. Side channels 226 and 228 are plated for making electrical connections to Z-directed component 220 from various layers of PCB 200. As shown, the ground plane traces on layers 202, 206, and 208 of PCB 100 are electrically connected to side channels 226 and 228. $V_{CC}$ plane 204 does not connect to Z-directed component 220 as shown by the gap 219 between $V_{CC}$ plane 204 and wall 217 of mounting hole 216.

FIG. 9 illustrates a top view of Z-directed component 220 in PCB 200. Three conductive traces 250, 252 and 254 lead up to the edge of wall 217 of mounting hole 216. As illustrated, trace 252 serves as a high-frequency signal trace to be passed from the top surface 212 to the bottom surface 214 of PCB 200 via Z-directed component 220. Conductive traces 250 and 254 serve as ground nets. Center lead or conductive channel 224 is electrically connected to trace 252 on the top surface 212 of PCB 200 by a top trace 245 and plating bridge 230. Top trace 245 on the top surface of Z-directed component 220 extends from the top end 224t of conductive channel 224 to the edge of Z-directed component 220. Although not shown, the bottom side of Z-directed component 220 and bottom surface 214 of PCB 200 is configured in a similar arrangement of traces as shown on top surface 212 of PCB 200 illustrated in FIG. 12. A bottom trace on the bottom surface of Z-directed component 220 extends from bottom of conductive channel 224 to the edge of Z-directed component 220. A plating bridge is used to make the electrical connection between the bottom trace and another high frequency signal trace provided on the bottom surface of PCB 200. The transmission line impedance of the Z-directed component can be adjusted to match the PCB trace impedance by controlling the conductor sizes and distances between each conductor which improves the high speed performance of the PCB.

During the plating process, wells 256 and 258 formed between wall 217 of mounting hole 216 and side channels 226 and 228 allow plating material or solder pass from the top surface 212 to the bottom surface 214 electrically interconnecting traces 250 and 254, respectively to side channels 226 and 228, respectively, of Z-directed component 220 and also to similarly situated traces provided on the bottom surface 214 of PCB 200 interconnecting ground planes or traces 202, 206 and 208. The plating is not shown for purposes of illustrating the structure. In this embodiment, $V_{CC}$ plane 204 does not connect to Z-directed component 220.

One of the challenges for high frequency signal speeds is the reflections and discontinuities due to signal trace transmission line impedance changes. Many PCB layouts try to keep high frequency signals on one layer because of these discontinuities caused by the routing of signal traces through the PCB. Standard vias through a PCB have to be spaced some distance apart which creates high impedance between the signal via and the return signal via or ground via. As illustrated in FIGS. 8 and 9, the Z-directed component and the return ground or signals have a very close and controlled proximity that allow essentially constant impedance from the top surface 212 to the bottom surface 214 of PCB 200.

Figure 10:
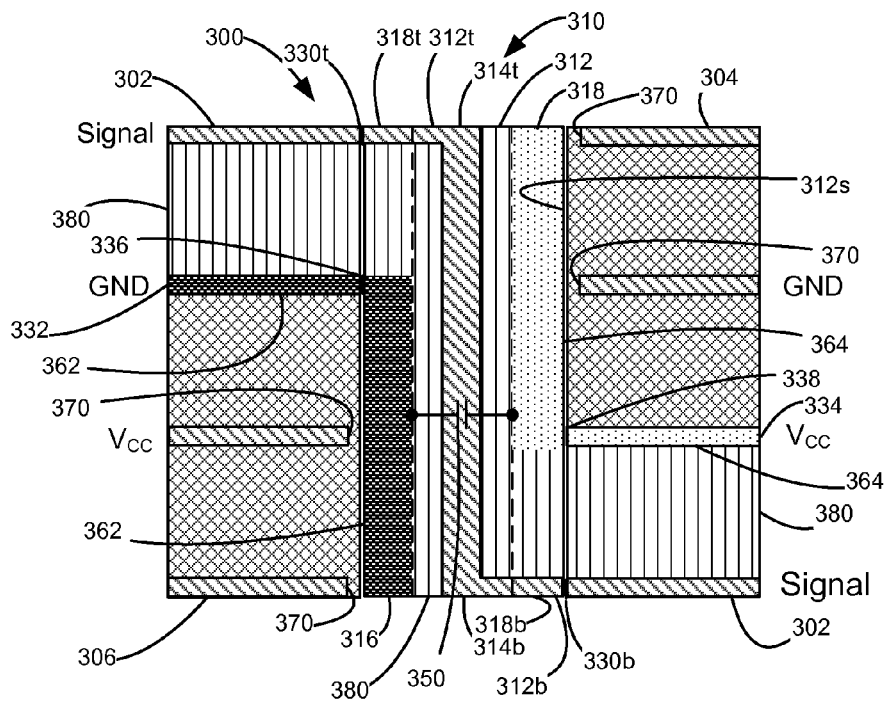
FIG. 10 is a schematic cross-sectional view of a Z-directed component flush mounted in a PCB showing ground loops for the Z-directed component with the Z-directed component further having a decoupling capacitor within its body according to one example embodiment.

A Z-directed signal pass through component may also comprise a decoupling capacitor that will allow the reference plane of a signal to switch from a ground plane, designated GND, to a voltage supply plane, designated $V_{CC}$, without having a high frequency discontinuity. FIG. 10 shows a cross-sectional view of a typical 4-layer PCB 300 with a signal trace 302 transferring between the top layer 304 and the bottom layer 306. Z-directed component 310, similar to that shown in FIG. 5D, having body 312 connects signal trace 302 through center conductive channel 314. Z-directed component 310 also comprises plated side channels 316 and 318 extending along the side surface 312s of the body 312. The top 314t and bottom 314b of conductive channel 314 are connected to conductive traces 318t and 318b on the top 312t and bottom 312b of body 312. These, in turn, are connected to signal trace 302 via top and bottom plating bridges 330t and 330b. Side channels 316 and 318 are plated to GND plane 332 and $V_{CC}$ plane 334, respectively. Connection points 336 and 338, respectively, illustrate this electrical connection. Schematically illustrated decoupling capacitor 350 is internal to body 312 and is connected between side channels 316 and 318. Decoupling capacitor 350 may be a separate capacitor integrated into the body 312 of Z-directed component 310 or it can be formed by fabricating a portion of the body 312 of Z-directed component 310 from the required materials with dielectric properties between conductive surfaces.

The path for signal trace 302 is illustrated with diagonal hatching and can be seen to run from top layer 304 to bottom layer 306. GND plane 332 and side channel 316 are electrically connected at 336 with the signal path return indicated by the dark stippling 362. $V_{CC}$ plane 334 and side channel 318 are electrically connected at 338 with the signal path return indicated by the light stippling 364. As is known in the art, where a signal plane or trace is not to be connected to the inserted part, those portions are spaced apart from the component as shown at 370. Where a signal plane or trace is to be connected to an inserted component, the signal plane or trace is provided at the wall or edge of the opening to allow the plating material or solder to bridge therebetween as illustrated at points 330t, 330b, 336, and 338.

The vertically hatched portion 380 shows the high speed loop area between the signal trace and return current path described by the signal trace 302 and the GND plane 332 or $V_{CC}$ plane 334. The signal trace 302 on the bottom surface 306 is referenced to power plane $V_{CC}$ 334 that is coupled to the GND plane 332 through decoupling capacitor 350. This coupling between the two planes will keep the high frequency impedance close to constant for the transition from one return plane to another plane of a different DC voltage.

Figure 11:
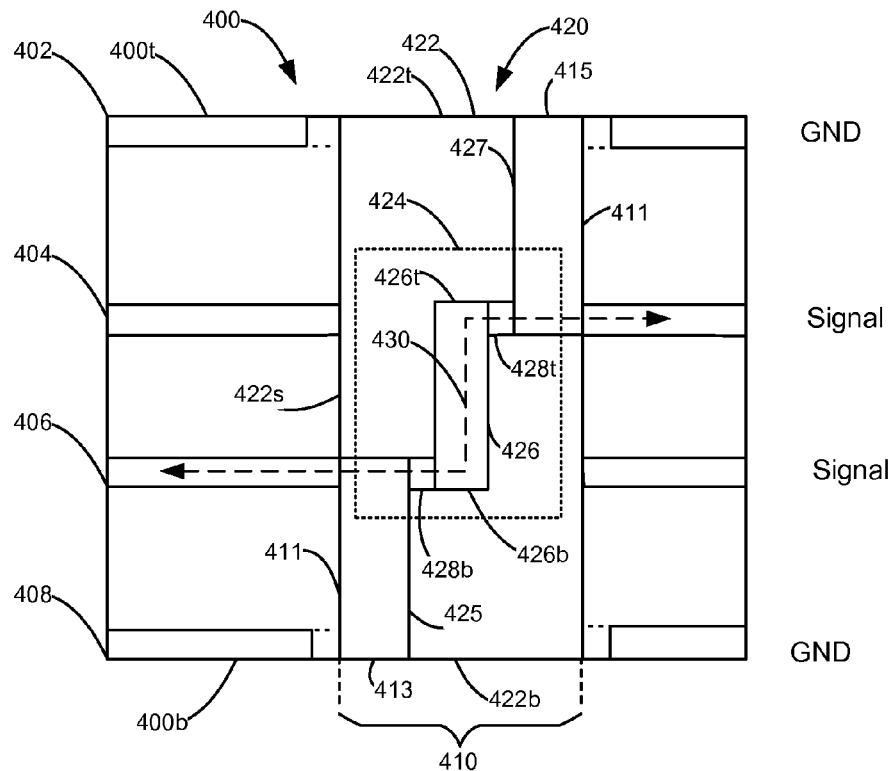
FIG. 11 is a schematic cross-sectional view of a Z-directed component flush mounted in a PCB showing a Z-directed component for transferring a signal trace from one internal layer of a PCB to another internal layer of that PCB according to one example embodiment.

Internally mounting Z-directed components in a PCB greatly facilitates the PCB technique of using outer ground planes for EMI reduction. With this technique, signals are routed on the inner layers as much as possible. FIG. 11 illustrates one embodiment of this technique. PCB 400 is comprised of, from top to bottom, top ground layer 402, internal signal layer 404, internal signal layer 406 and bottom ground layer 408. Ground layers 402 and 408 are on the top and bottom surfaces 400t and 400b of PCB 400. A mounting hole 410, shown as a through-hole, extends between the top and bottom surfaces 400t and 400b. Z-directed component 420 is shown flush mounted in PCB 400. Z-directed component 420 comprises body 422 having a center region 424 intermediate the top 422t and bottom 422b of body 422 and two side channels 425 and 427 on side surface 422s.

Side channels 425 and 427 and wall 411 of hole 410 form plating wells 413 and 415 respectively. Center region 424 is positioned within body 422 and extends a distance approximately equal to the distance separating the two internal signal layers 404 and 406. Side channel 425 extends from the bottom surface 422*b* of body 422 to internal signal level 406 while side channel 427 extends from top surface 422*t* of body 422 to internal signal level 404. Here, side channels 425 and 427 extend only along a portion of side surface 422*s* of body 422. Conductive channel 426 extends through center region 424 but does not extend to the top and bottom surfaces 422*t*, 422*b* of body 422. FIG. 5H illustrates a partial channel similar to side channel 427. Conductive channel 426 has conductive traces 428*t* and 428*b* extending from the top 426*t* and bottom 426*b* of conductive channel 426 to side channels 427 and 425, respectively. While illustrated as separate elements, conductive channel 426 and traces 428*t*, 428*b* may be one integrated conductor electrically interconnecting side channels 425, 427. As shown, conductive trace 428*b* is connected to internal signal layer 406 via plated side channel 425 and well 413 while trace 428*t* connects to internal signal level 404 via side channel 427 and well 415. Ground layers 402 and 408 are not connected to Z-directed component 420 and are spaced away from mounting hole 410 as previously described for FIGS. 8 and 10. As shown by double headed dashed arrow 430, a signal on signal layer 406 can be via'd to signal layer 404 (or vice versa) via Z-directed component 420 through a path extending from well 413, side channel 425, trace 428*b*, conductive channel 426, trace 428*t*, side channel 427, and well 415 to allow the signal to remain on the inner layers of PCB 400 with ground layers 402 and 408 providing shielding.

Z-Directed Decoupling Capacitors

Figure 12:
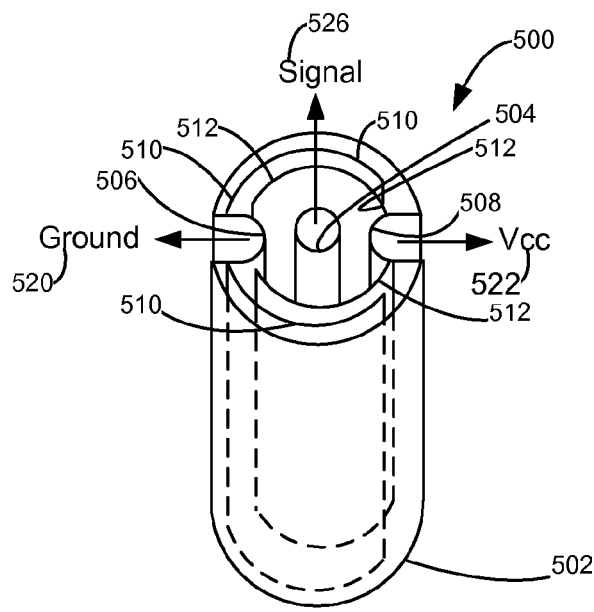
FIG. 12 is a perspective view of a Z-directed capacitor having semi-cylindrical sheets according to one example embodiment.
Figure 13:
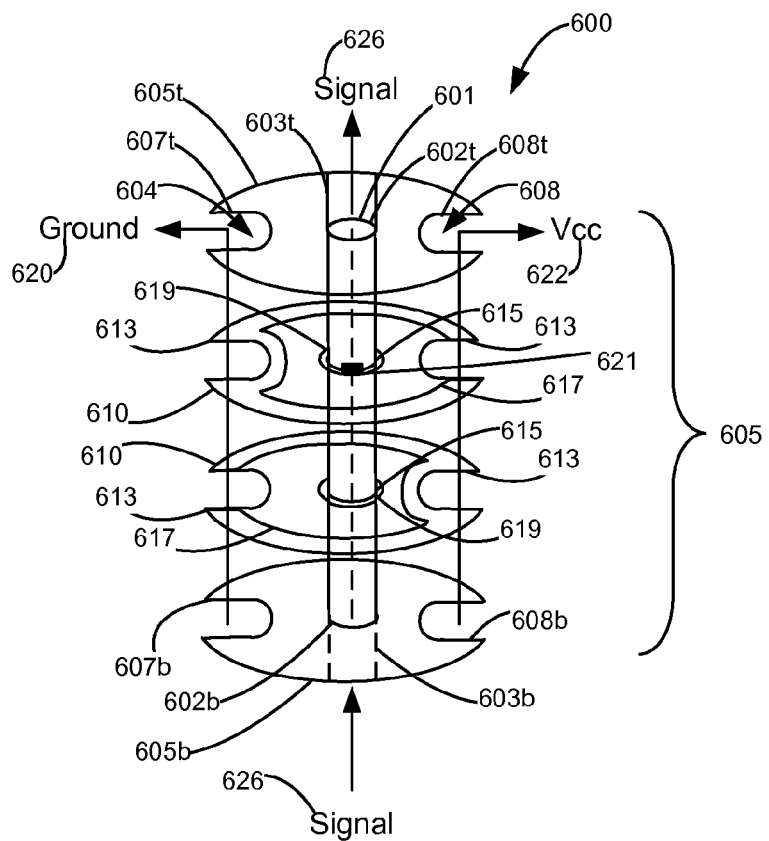
FIG. 13 is an exploded view of another embodiment of a Z-directed capacitor having stacked discs according to one example embodiment.

FIGS. 12 and 13 illustrate two additional example Z-directed components in the form of decoupling capacitors. In FIG. 12, a Z-directed capacitor 500 is shown with a body 502 having a conductive channel 504 and two side channels 506 and 508 extending along its length similar to those previously described. Conductive channel 504 is shown connected to a signal 526. Vertically oriented interleaved partial cylindrical sheets 510, 512 forming the plates of Z-directed capacitor 500 are connected to reference voltages such as voltage $V_{CC}$ and ground (or any other signals requiring capacitance) and are used with intervening layers of dielectric material (not shown). Partial cylindrical sheet 510 is connected to plated channel 506 which is connected to ground 520. Partial cylindrical sheet 512 is connected to plated channel 508 which is connected to supply voltage $V_{CC}$ 522. Sheets 510, 512 may be formed of copper, aluminum or other material with high conductivity. The material between the partial cylindrical sheets is a material with dielectric properties. Only one partial cylindrical sheet is shown connected to each of $V_{CC}$ 522 and ground 520; however, additional partial cylindrical sheets may be provided to achieve the desired capacitance/voltage rating.

Another embodiment of a Z-directed capacitor is shown in FIG. 13 using stacked support members connected to voltage $V_{CC}$ or ground. Z-directed capacitor 600 is comprised of center conductive channel 601 and a body 605 comprised of a top member 605*t*, a bottom member 605*b*, and a plurality of support members 610 (illustrated as disks) between the top and bottom members 605*t*, 605*b*.

Center conductive channel 601 extends through openings 615 in the assembled Z-directed capacitor 600 and openings 602*t* and 602*b*, all of which are sized to closely receive the center conductor. Center conductive channel 601 is electrically connectable to conductive traces 603*t* and 603*b* on the top and bottom portions 605*t*, 605*b* forming a signal path for signal 626. This connection is made by plating or soldering. Center conductive channel 601 is connected to signal 626 via conductive trace 603*t*. The bottom end of conductive channel 601 is connected in a similar fashion to a signal trace (not shown) via conductive trace 603*b*.

Opposed openings 607*t* and 608*t* are provided at the edge of top portion 605*t*. Bottom portion 605*b* is of similar construction as top portion 605*t* having opposed openings 607*b* and 608*b* provided at the edge. Between top and bottom portions 605*t*, 605*b* are a plurality of support members 610, which provide the capacitive feature. Support members 610 each have at least one opening 613 at their outer edge and an inner hole 615 allowing for passage of conductive channel 601 therethrough. As shown, two opposed openings 613 are provided in each support member 610. When assembled, the opposed openings 607*t*, 607*b*, 608*t*, 608*b*, and 613 align to form opposed side channels 604 and 608 extending along the side surface of Z-directed capacitor 600. Side channel 604 is shown connected to reference voltage such as ground 620 and side channel 606 to another reference voltage such as $V_{CC}$ 622. Support members 610 may be fabricated from a dielectric material and may be all of the same or varying thickness allowing for choice in designing the desired properties for Z-directed capacitor 600.

Annular plating 617 is provided on one of top and bottom surfaces of support member 610 or, if desired, on both surfaces Annular plating is shown on the top surface of each support member but location of the annular plating can vary from support member to support member. Annular plating 617 generally conforms to the shape of the support member and extends from one of the edge openings 613 toward the other if an additional opening is provided. The annular plate 617 is of a diameter or dimension or overall size that is less than the diameter, dimension or overall size of support member 610 on which it is affixed. While the plate 617 is described as annular, other shapes may also be used provided that the plating does not contact the center conductive channel or extend to the edge of the support member on which it is plated or otherwise affixed. The annular plate does contact one of the edge openings 613 but is spaced apart from the other openings if more than one channel is present in the side surface of the body of Z-directed capacitor 600. Also, there is an opening 619 in annular plate 617 having a larger diameter than opening 615 in annular plate 617 through which conductive channel 601 passes. Opening 619 has a larger diameter than that of conductive channel 601 leaving annular plate 617 spaced apart from conductive channel 601.

As illustrated, the support members 610 are substantially identical except that when stacked, alternate members are rotated 180 degrees with respect to the member above or below it. This may be referred to as a 1-1 configuration. In this way, alternate members will be connected to one or the other of the two side channels. As shown in FIG. 13, the annular plating on the upper one of the two support members 610 is connected to side channel 608 and voltage $V_{CC}$ 622 while the annular plating on the lower one of the two support members 610 is connected to side channel 604 and ground 620. Other support member arrangements may also be used such as having two adjacent members connected to the same channel with the next support member being connected to the opposite channel which may be referred to as a 2-1 configuration. Other configurations may include 2-2, 3-1 and are a matter of design choice. The desired capacitance or voltage rating determines the number of support members that are inserted between top and bottom portions 605*t*, 605*b*. Although not shown, dielectric members comprised of dielectric material and similarly shaped to support members 610 may be interleaved with support members 610. Based on design choice, only a single channel may be used or more channels may be provided and/or the annular plating may be brought into contact with the center conductive channel and not in contact with the side channels. Again, the embodiments for Z-directed capacitors are for purposes of illustration and are not meant to be limiting.

With either design for a Z-directed capacitor, a second conductive channel may be provided in parallel with the first conductive channel that is disposed within the conductive plates to create a differential decoupling capacitor. Another embodiment of a Z-directed capacitor can be constructed from FIG. 12 or FIG. 13 by connecting the center conductive channel to one of the reference voltages at each support member that also has its annular plating connected to the same reference voltage. This may be accomplished simply by connecting the conductive channel to the annular plating as schematically illustrated by the jumper 621. In practice, the annular opening 619 in the annular plate 617 would be sized so that the annular plate and conductive channel 601 would be electrically connected. This component may be placed directly below a power pin or ball of an integrated circuit or other surface mounted component for optimum decoupling placement.

Again, the Z-directed signal pass-through components illustrated in FIGS. 8-11 and the Z-directed decoupling capacitors illustrated in FIGS. 12 and 13 provide merely a few example applications of a Z-directed component. Those skilled in the art will appreciate that various other types of Z-directed components may be utilized including, but not limited to, transmission lines, delay lines, T filters, decoupling capacitors, inductors, common mode chokes, resistors, differential pair pass throughs, differential ferrite beads, diodes, or ESD protection devices (varistors).

Spin Coat Process for Manufacturing a Z-Directed Component

A spin coat process for manufacturing the Z-directed components on a commercial scale is provided. In the spin coat process, the bodies of the Z-directed components are formed from a liquid based material, such as a slurry, that forms the component substrate. As needed, the substrate material may also be mixed with a binder material as is known in the art. As discussed above, a variety of different Z-directed components are contemplated herein including, but not limited to, transmission lines, delay lines, T filters, decoupling capacitors, inductors, common mode chokes, resistors, differential pair pass throughs, differential ferrite beads, diodes, and ESD protection devices (varistors). Accordingly, it will be appreciated that the substrate material used will depend on the Z-directed component desired. The substrate material may include a single dielectric material that has a relative permittivity from about 3, e.g., polymers, to over 10,000, e.g., barium titanate ($BaTiO_3$). For example, a material with a relatively high dielectric value may be used in a Z-directed decoupling capacitor and a material with a relatively low dielectric value may be used in a Z-directed signal pass-through component. If a Z-directed component is desired to have an inductive function or a delay line then a ferrite material may be selected that has a low or high relative permeability with a range of about 1 to about 50,000. If a Z-directed component is desired to have some degree of conductivity then a conductive material may be mixed with a dielectric material to create a desired resistance. Depending on the function of the Z-directed component desired, these or other compatible materials may be mixed together to form a component layer.

Figure 14:
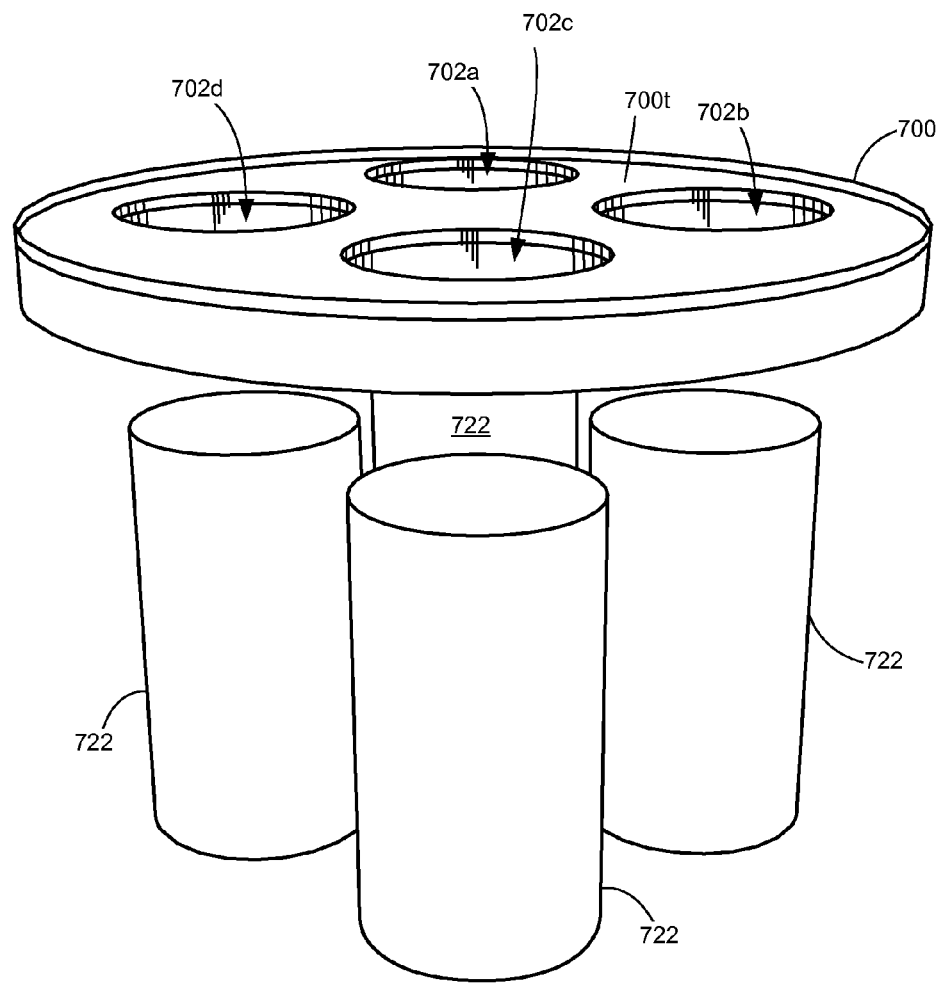
FIG. 14 is a perspective view of a rotatable plate having cavities therein each for forming a layer of a Z-directed component according to one example embodiment.

With reference to FIG. 14, a rotatable plate 700 is illustrated having a top surface 700t and four cavities 702a, 702b, 702c, 702d therein. Each cavity 702a, 702b, 702c, 702d defines the shape of a layer of the Z-directed component. As discussed in greater detail below, cavities 702a, 702b, 702c, 702d are filled with a liquid based substrate material, such as a slurry, to form the body of a layer of the Z-directed component. Although four cavities 702a, 702b, 702c, 702d are illustrated, any suitable number of cavities 702 may be used including greater than or fewer than four. For example, for commercial production purposes, it may be desired to use a plate 700 having more than four cavities 702 in order to process more parts at a time. In some embodiments, the height of each cavity 702 is between about 0.5 mil and about 62 mil (about 0.0127 mm and about 1.57 mm), including all increments and values therebetween, depending on the application in which the Z-directed component will be used.

Figure 15:
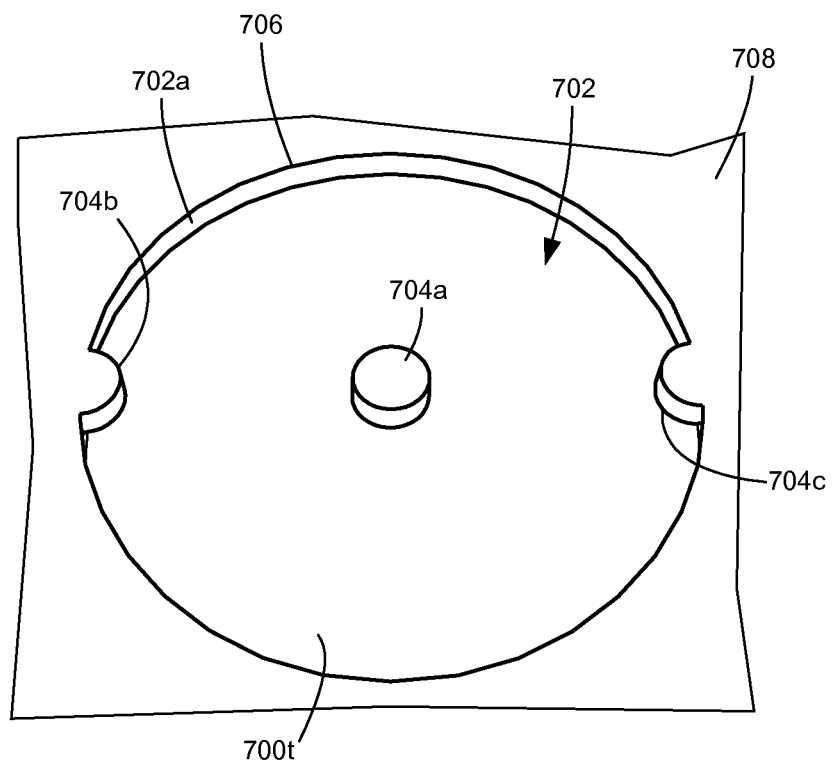
FIG. 15 is a perspective view of a cavity formed on the rotatable plate shown in FIG. 14 according to one example embodiment.

An example cavity 702 is shown in FIG. 15 according to one embodiment. A generally cylindrical cavity 702 having substantially vertical walls 702a is illustrated; however, as discussed above, many different shapes may be used. In this embodiment, cavity 702 includes an interior projection 704a for forming a corresponding interior channel in the component layer. Cavity 702 also includes a pair of projections 704b, 704c along an edge 706 of cavity 702 for forming corresponding side channels in the component layer. In the example embodiment illustrated, projection 704a is cylindrical and projections 704b, 704c are semi-cylindrical; however, any suitable shape may be used as desired. Further, although one interior projection 704a and two side projections 704b, 704c are illustrated; any suitable number of side and/or interior projections 704 may be used depending on the desired number of side and interior channels, respectively, through the component layer.

In the example embodiment illustrated, cavity 702 is formed by masking top surface 700t of plate 700 using photochemical methods. In this embodiment, a radiation-sensitive photoresist 708 is applied to top surface 700t and then selectively exposed to a radiation source, such as X-ray or UV light. The photoresist 708 is then developed to wash away the areas where the photoresist layer 708 is not desired in order to form the desired cavities 702 therein. If a different mask is desired later, the photoresist mask 708 can be removed and a new mask can be formed on top surface 700t. As an alternative to a photoresist mask, a physical mask or plate may be placed on top surface 700t and then removed after it's been used. Alternatively, plate 700 may include permanent cavities 702 formed therein.

Figure 16A:
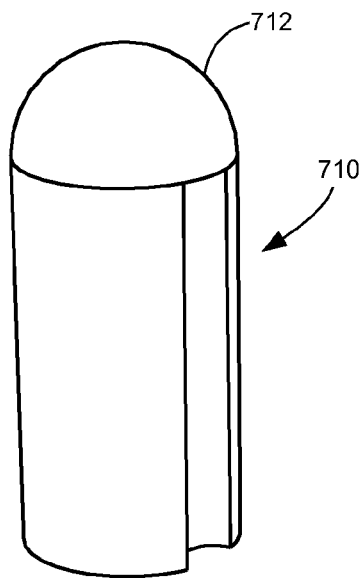
FIG. 16A is a perspective view of a Z-directed component having a dome formed on an end thereof according to one example embodiment.
Figure 16B:
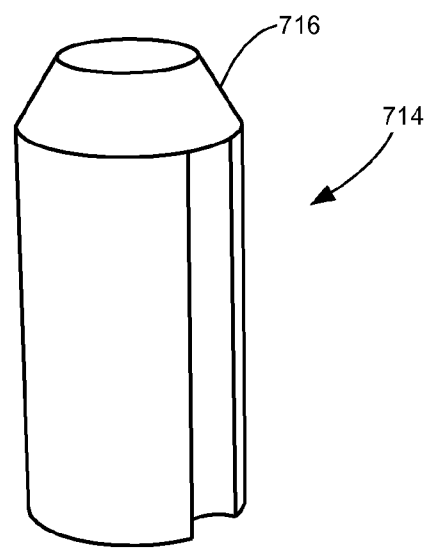
FIG. 16B is a perspective view of a Z-directed component having a chamfered end according to one example embodiment.

In some embodiments, a chamfer, dome or other form of taper or lead-in of at least one of the top and bottom edge of the Z-directed component is desired in order to ease insertion of the Z-directed component into the mounting hole in the PCB. For example, FIG. 16A shows a Z-directed component 710 having a dome 712 formed on an end thereof. FIG. 16B shows a Z-directed component 714 having a chamfered end 716. The dome 712 or chamfer 716 may be part of the component or attached thereto. In one embodiment, the dome 712 or chamfer 716 is a separate part that is partially inserted into the mounting hole in the PCB. In this embodiment, the Z-directed component is then inserted behind the dome 712 or chamfer 716 to push it through the mounting hole causing the dome 712 or chamfer 716 to expand the mounting hole and prevent the component from cutting or tearing the PCB. Where the dome 745 or chamfer 747 is attached to the Z-directed component, it may be configured to remain attached to the Z-directed component following insertion into the mounting hole in the PCB or it may be used to facilitate insertion and then removed.

Figure 17:
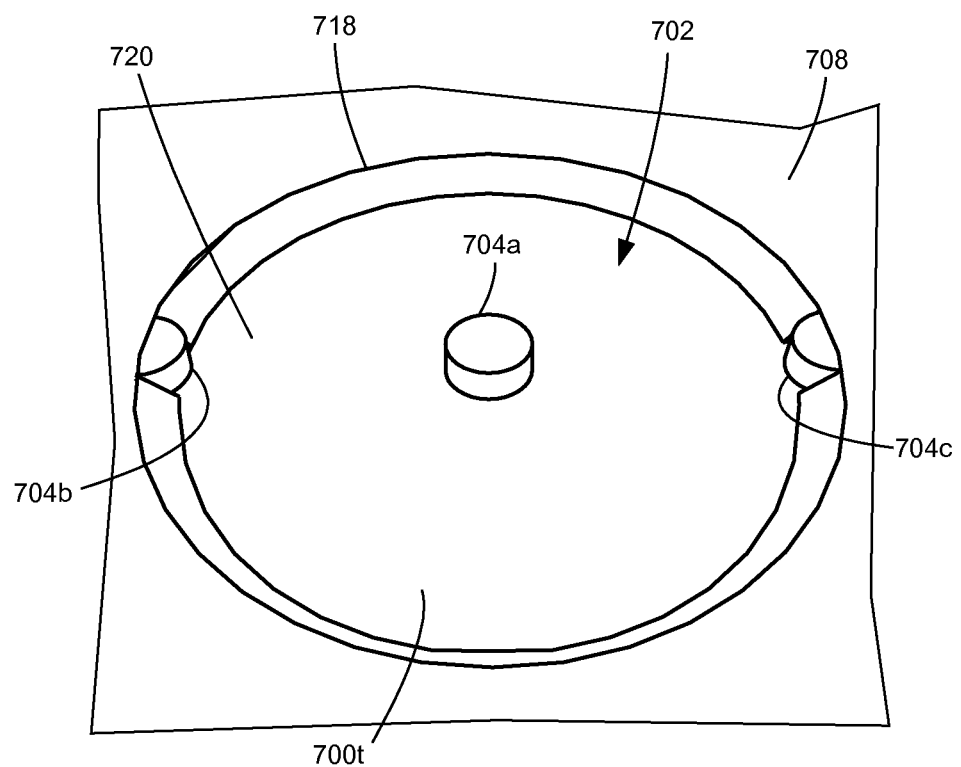
FIG. 17 is a perspective view of a cavity formed on the rotatable plate shown in FIG. 14 for forming a taper in an end of a Z-directed component according to one example embodiment.

With reference to FIG. 17, one method for forming the desired taper as part of the Z-directed component includes the use of a cavity 702 that has tapered rim 718 around a periphery of a bottom portion 720 of cavity 702. Tapered rim 718 is chamfered in the example embodiment illustrated; however, a domed, elliptical or rounded rim may also be used depending on the shape of the taper desired. When cavity 702 is filled with the desired liquid based substrate material, tapered rim 718 forms a corresponding taper in a bottom surface of the component layer. Where cavity 702 is formed in a photoresist layer 708, tapered rim 718 may be formed by angling the radiation source during the exposure step described above or by using grayscale lithography techniques known in the art that locally control the intensity of the radiation source and/or the duration of exposure. It will be appreciated that where the desired taper extends across multiple component layers, successive layers 730 of the Z-directed component forming the taper will have decreasing diameters (or widths in the case of a layer 730 with a non-circular cross-section). Alternatively, the desired taper may be formed in a single component layer 730.

Referring back to FIG. 14, a liquid based substrate material, such as a slurry, is deposited in cavities 702. The liquid based substrate material may be deposited directly in each cavity 702 or it may be applied to a center portion of the top surface 700t of plate 700 and transferred by centrifugal force into cavities 702a, 702b, 702c, 702d when plate 700 is rotated. After the liquid based substrate material is applied to plate 700, plate 700 is spun so that the substrate material flows into a thin, even layer in each cavity 702.

After cavities 702 have been coated with the substrate material, the liquid based substrate material is cured to solidify the layer into a stable, usable part. The liquid based substrate material may be cured by allowing it to dry, by heating it, by applying radiation, such as IR or UV light, or by a combination of these curing steps. Pressure may also be applied after the liquid based substrate material has been partially solidified. The required pressure can be applied by pressing down on the layer in each cavity 702 with a rod or plug to compress it. Heat can be applied from the top, bottom and/or the sides of each cavity 702. For example, heating elements can be embedded into the walls of plate 700 in order to supply a desired temperature profile to the layer in cavity 702.

Figure 18:
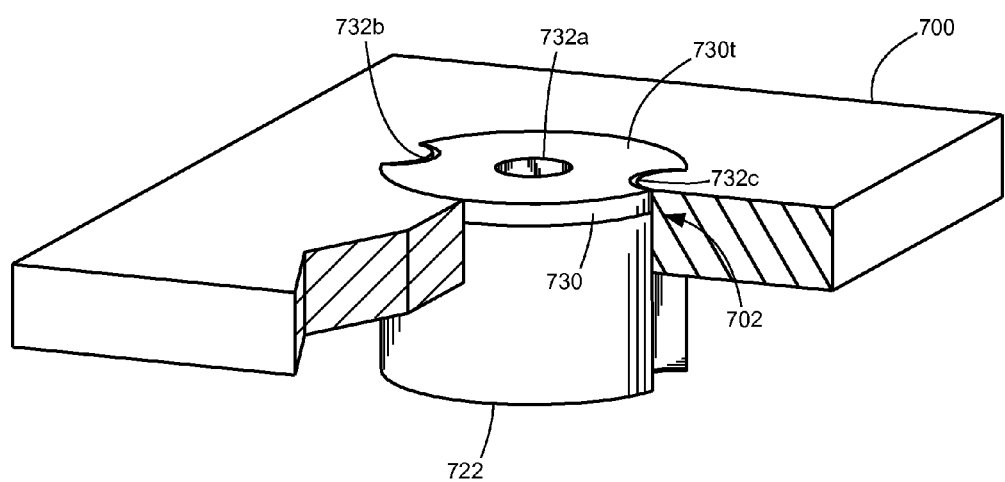
FIG. 18 is a perspective cutaway view of a rotatable plate having a layer of a Z-directed component supported by a raisable elevator in a cavity of the plate according to one example embodiment.
Figure 19:
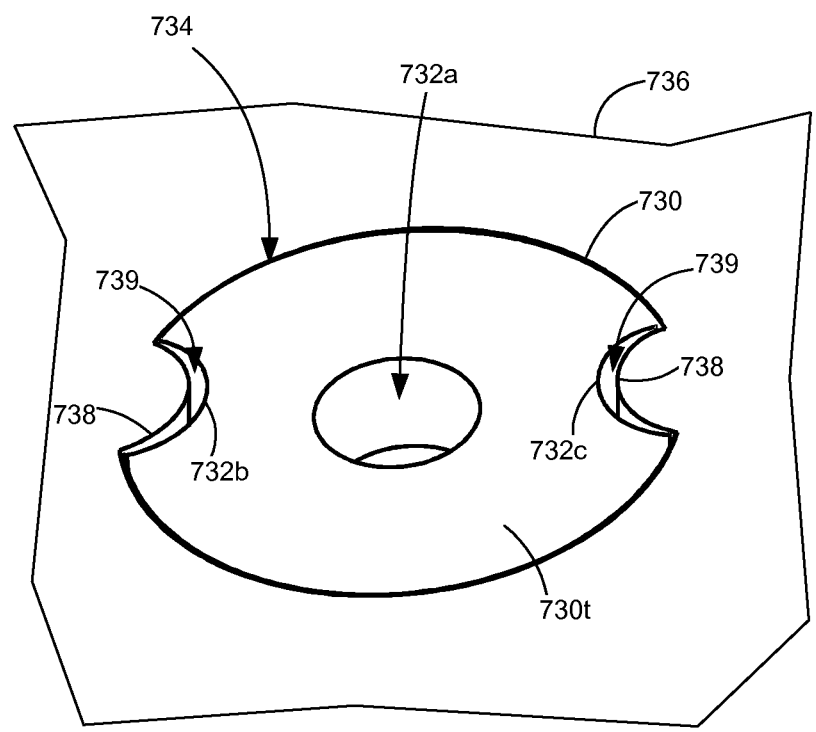
FIG. 19 is a perspective view of a layer of a Z-directed component in a constraining plate with a gap formed between a side wall surface of the constraining plate and a side channel of the layer according to one example embodiment.

FIG. 18 shows a layer 730 of the Z-directed component formed by the example cavity 702 shown in FIG. 15. Layer 730 includes one center channel 732a and two side channels 732b, 732c that correspond with projections 704a, 704b and 704c, respectively. As discussed above, the shape of layer 730 and the number of channels 732 therein, as well as their placement and shape, can be altered by the changing the shape of cavity 702 and/or projections 704. At this point, layer 730 is ready to receive conductive material on at least one surface thereof. Conductive material may be applied to one or more of channels 732a, 732b, 732c, a top surface 730t and/or both top surface 730t and a bottom surface of layer 730. The conductive material may be applied while layer 730 is in cavity 702 or layer 730 can be transferred to another tool having restraining and locating ability, such as, for example a conveyor belt, to receive the conductive material. If it is desired to plate one or more side channels in the component layer 730, such as side channels 732b, 732c, layer 730 may be placed in a cavity 734 in a constraining plate 736 that has a side wall surface 738 that is spaced from the side channels 732b, 732c in the component layer 730 such that a gap 739 is formed therebetween (FIG. 19). This spacing allows conductive material to flow into gap 739 to plate the desired side channel(s) 732b, 732c. Another alternative to plate side channels 732b, 732c is to apply conductive material after the Z-directed component has been assembled by painting, jetting, sputter, or other known methods.

Figure 20:
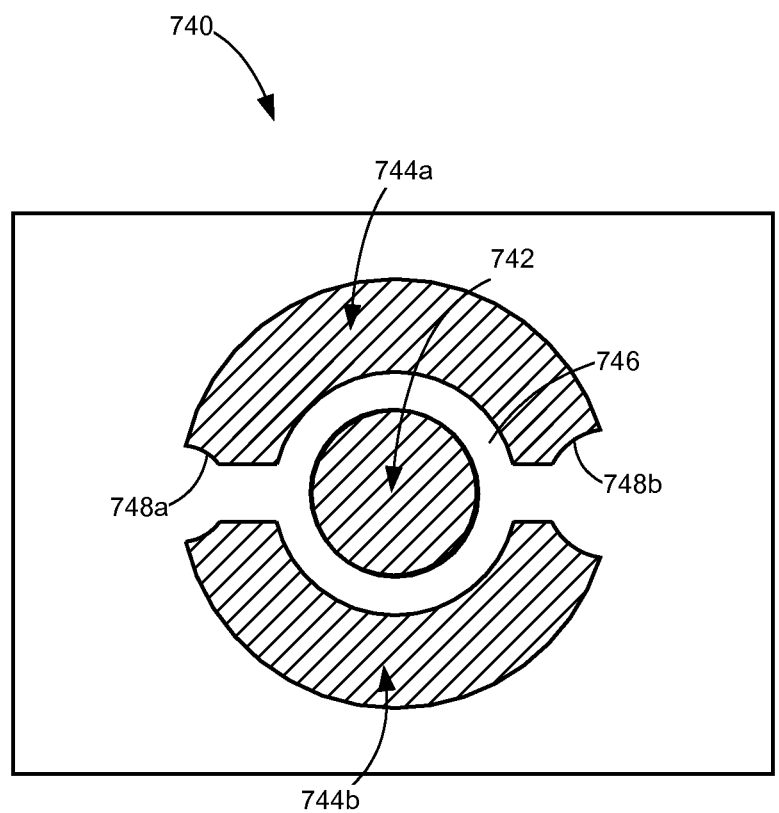
FIG. 20 is a schematic view of a mask for applying conductive material to a layer of a Z-directed component according to one example embodiment.

A number of different methods may be used to apply conductive material to layer 730. For example, in one embodiment, a mask is applied to top surface 730t that restricts the application of conductive material to selected portions of top surface 730t. Conductive material is then screened through the mask onto the component layer 730. FIG. 20 shows an example mask in the form of a physical mask 740 that is placed on top surface 730t of layer 730. The diagonal hatching included in FIG. 20 illustrates the openings in mask 740. Mask 740 includes a center opening 742 that permits conductive material to flow into and plate center conductive channel 732a. Mask 740 also includes a pair of peripheral openings 744a, 744b that permit conductive material to plate top surface 730t. Peripheral openings 744a, 744b are separated by a thin mask portion 746 that also separates center opening 742 from peripheral openings 744a, 744b. Portion 746 is required when one or more conductive channels through the interior of the layer 730 are desired in order to provide one or more interior openings in the mask such as center opening 742 in mask 740. Mask 740 includes a pair of scalloped portions 748a, 748b that are positioned above side channels 732b, 732c in the example embodiment illustrated. Scalloped portion 748b projects slightly further inward than scalloped portion 748a. As a result, in this example embodiment, conductive material is permitted to flow onto the portion of top surface 730t that connects with side channel 732b but conductive material is not permitted to connect with side channel 732c.

Figure 21:
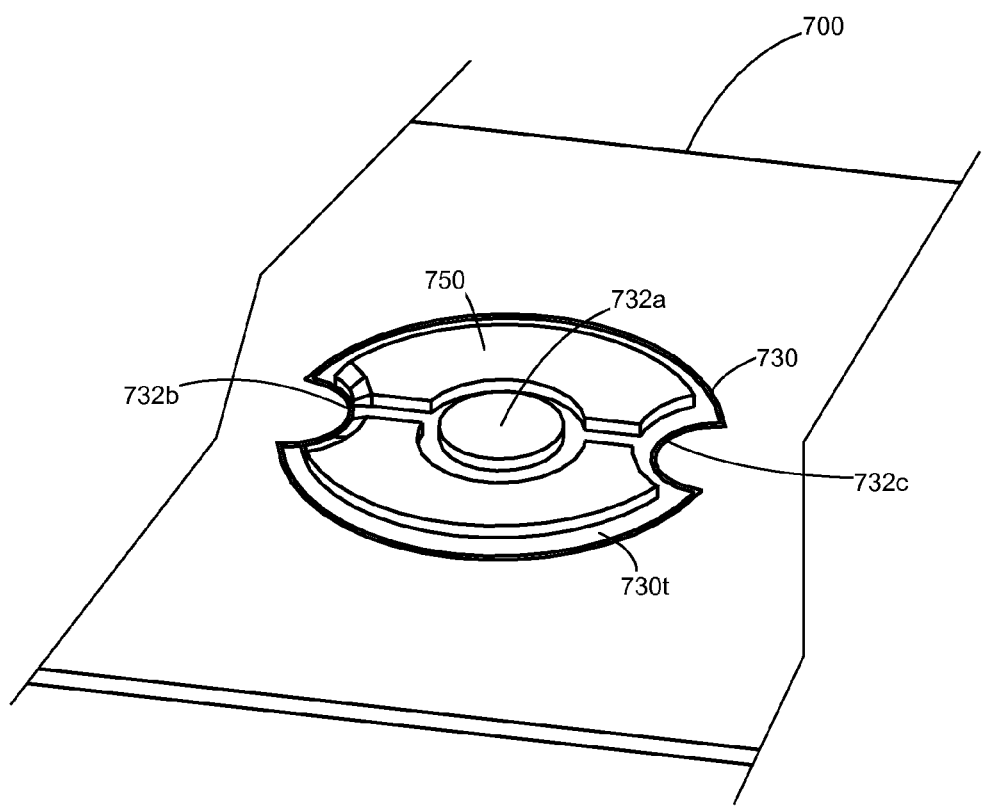
FIG. 21 is a perspective view of a layer of a Z-directed component in a constraining plate having conductive material applied through the mask shown in FIG. 20 to a top surface of the layer.

The resulting plated layer 730 utilizing example mask 740 is shown in FIG. 21 having conductive material 750 thereon. As shown, center channel 732a has been plated with conductive material 750. Top surface 730t of layer 730 has been plated to make a connection with side channel 732b but not side channel 732c. The mask 740 shown in FIG. 20 is intended to illustrate one example of a suitable mask. Alternative masks may be employed depending on such factors as the shape of the layer, the number of center channels and/or side channels that require plating, and the plating pattern desired for top surface 730t.

As an alternative to a physical mask, such as mask 740, a photoresist mask may be applied using photochemical methods known in the art. In this embodiment, a radiation-sensitive photoresist is applied to top surface 730t and then selectively exposed to a radiation source, such as X-ray or UV light. The photoresist is then developed to wash away the areas where the photoresist layer is not desired. It will be appreciated that positive or negative photoresists may be used as desired. Conductive material can then be screened through the photoresist mask onto top surface 730t of the component layer 730 such as by spin coating liquid conductive material on top of the photoresist mask. After the conductive material is applied, the remaining photoresist can then be removed.

In another embodiment, instead of using a mask, a selective jetting process is used to apply conductive material to top surface 730t and/or channel(s) 732. In this embodiment, liquid conductive material is applied to the component layer 730 using a fluid ejection mechanism as is known in the art. Where an etchable conductive material is used, another alternative is to spin coat or otherwise apply a layer of liquid conductive material across the entire top surface 730t and then selectively etch the conductive material from top surface 730t to form the desired conductive pattern thereon.

Another alternative is to first selectively apply a seed layer of conductive material to the component layer 730 and then apply additional conductive material by electrolysis techniques. One suitable method for applying the seed layer includes the use of photochemical methods. A photoresist layer is applied across the entire top surface 730t of the Z-directed component layer 730 and then selectively exposed to a radiation source. The photoresist is then developed to wash away the areas where the photoresist layer is not desired. Again, positive or negative photoresists may be used as desired. Conductive material is then applied across the entire top surface 730t of the Z-directed component layer 730. The remainder of the photoresist is then etched away thereby also removing the conductive material from those areas where the seed layer is not desired. Electrolysis techniques are then applied to thicken the layer of conductive material on the component layer 730.

The various methods for applying conductive material to the Z-directed component layer described herein are equally applicable where it is desired to apply a material other than conductive material such as, for example resistive, magnetic, dielectric, or semi-conductive material to component layer 730. It will be appreciated that channel(s) 732 do not need to be plated after each layer is formed. Rather, channel(s) 732 may be filled with conductive material after the component layers are stacked together.

The Z-directed component is formed from a stack of component layers 730. Each layer may be formed from the same substrate material or some layers may be formed from different substrate materials. With reference back to FIGS. 14 and 18, in the example embodiment illustrated, a raisable elevator 722 is positioned in each cavity 702. Elevator 722 allows successive layers of the Z-directed component to be conveniently stacked on top of each other. In one embodiment, elevator 722 is first positioned in cavity 702 to form a first layer 730 of the Z-directed component. Liquid based substrate material is deposited in cavity 702, plate 700 is spun, and the first layer 730 is formed as discussed above. Conductive material is applied to the first layer 730 as desired. Elevator 722 is then lowered to create additional space in cavity 702 on top of the first layer 730. The additional space in cavity 702 is then filled with additional liquid based substrate material, plate 700 is spun again and a second layer 730 of the Z-directed component is formed as described above. Conductive material is then applied to the second layer 730 as desired. This process is repeated until all of the layers 730 for a given Z-directed component are formed and stacked.

Alternatively, multiple stackable plates 700 may be used to form the Z-directed component. Each of the stackable plates 700 has a cavity 702 for forming a layer 730 of the Z-directed component therein. A bottom portion of the cavity 702 of the lowermost plate 700 is closed to support the stack of component layers 730 while the cavities 702 of the plates 700 stacked above the lowermost stack are open at the bottom to permit stacking of the component layers on top of each other. Alternatively, the lowermost plate 700 may be positioned on a flat plate to retain the formed layer 730 in its cavity 702. After a first layer 730 has been formed in cavity 702 of a first plate 700 and conductive material has been applied, a second plate 700 is stacked on top of the first plate 700. A second layer 730 is then formed in cavity 702 of the second plate 700 as described above and conductive material is applied as desired. Again, this process can be repeated until all of the layers 730 for a given Z-directed component are formed and stacked. It will be appreciated that where layers 730 are formed using stackable plates and one or more interior channels 732 are desired, such channel(s) 732 would need to be formed, e.g., by punching, cutting, etc., after each layer 730 is formed or after layers 730 are stacked because each cavity 702 is not able to include the interior material required to form an interior channel 732.

Figure 22A:
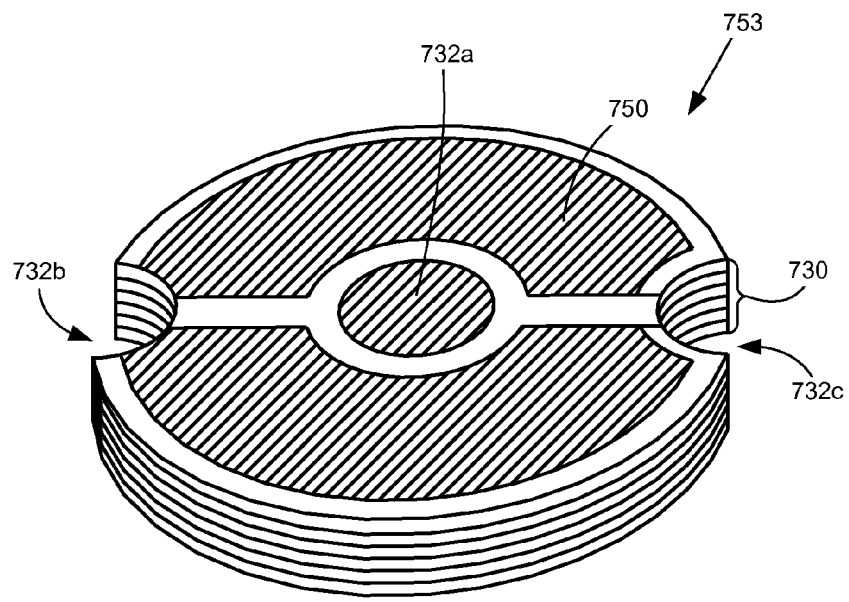
FIGS. 22A and 22B are perspective views of opposite ends of a Z-directed decoupling capacitor formed according to a powder screen manufacturing process according to one example embodiment.
Figure 22B:
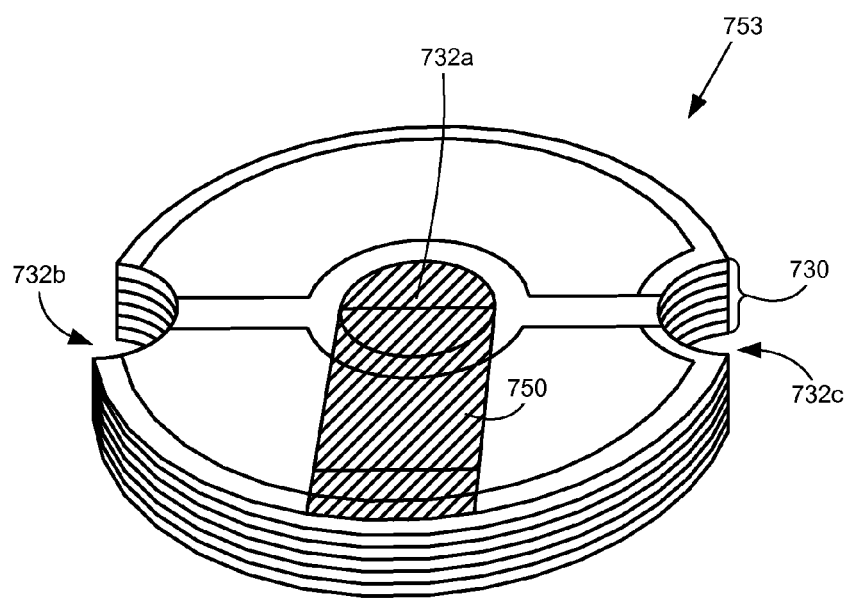

In another alternative embodiment, a conveyor is used to move all of the formed layers 730 for stacking after they are formed. The outside features of the layers 730 may be used to align the layers 730 with each other. As shown in FIGS. 22A and 22B, for a Z-directed capacitor 753, each layer 730 is alternatively stacked by rotating it 180 degrees with respect to the layer 730 immediately below creating positive and negative terminals on two sides of the Z-directed component. The stacking may be performed in a constraining plate that keeps the stack in position.

Figure 23:
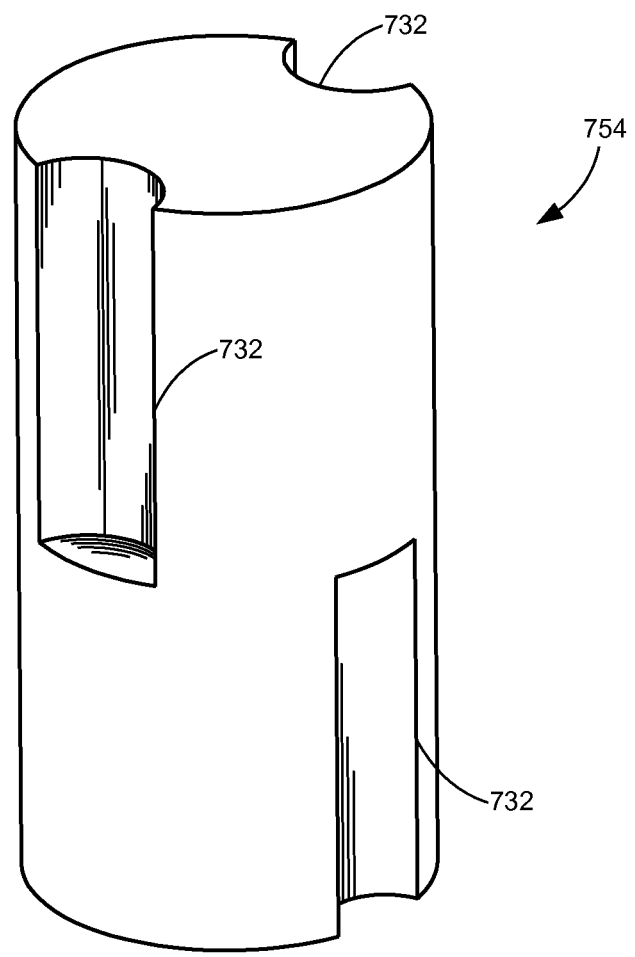
FIG. 23 is a perspective view of a Z-directed component having offset side channels according to one example embodiment.

In some embodiments, a Z-directed component 754 may be desired that includes partial side channels 732 that are twisted or offset from each other between the top and bottom halves of the component 754 as shown in FIG. 23. This type of component may be desired in order to permit an interior signal to enter on one side of the Z-directed component 754 and exit at a 90 degree angle thereto without running into a side channel 732. This offset can be accomplished by rotating the layers 730 as they are stacked. If a photoresist layer 708 is used to form cavity 702, each etch cycle may be carefully controlled such that the next layer of photoresist applied one top of each layer 730 is removed while leaving the desired photoresist projections 704 for support of subsequent layers 730. Resists that cannot be removed by the normal etching solvent alone can also be applied and baked into a hardened form on each photoresist layer 708 before the next photoresist layer 708 is applied in order to provide support for subsequent component layers 730. Where each layer 730 is desired to have the same thickness, etching of each photoresist layer 708 is performed for the same amount of time under the same conditions.

Figure 24:
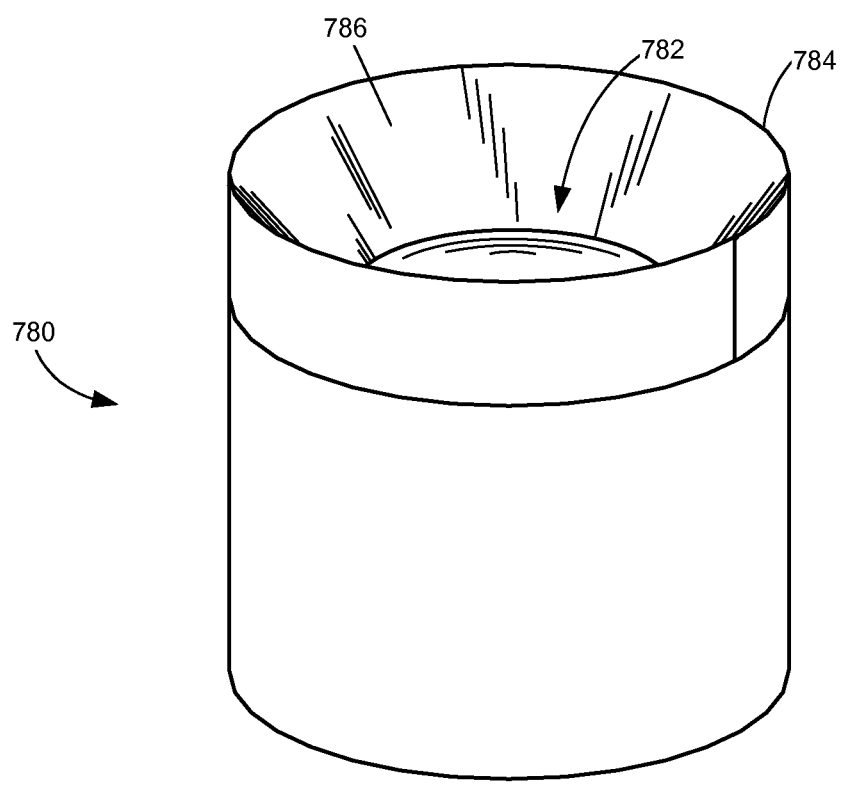
FIG. 24 is a perspective view of a plug for forming a taper in an end of a Z-directed component according to one example embodiment.

In one embodiment, once the component layers are stacked, they are compressed with moderate heat to create an aggregate that is solid enough to be removed from the plate(s) 700 or 736 in which they are positioned to be fired later. A movable component, e.g., a rod or a plug, applies a desired force to one end of the stacked layers to create the desired pressure profile for the materials chosen. Heating elements can be embedded into the walls of cavity 702 or 734 in order to supply a desired temperature profile to the stacked layers. Alternatively, rather than applying moderate heat, a full firing process is performed in plate(s) 700 or 736. However, this may be difficult due to the extreme temperatures that are subjected to the constraining elements. If a taper of the top and/or bottom of the Z-directed component is desired and it has not already been formed, a plug 780 as shown in FIG. 24 having a recess 782 formed in an end 784 thereof that has a tapered rim 786 around a periphery of recess 782 may be used to compress the stacked component layers. When plug 780 applies a force to an end of the stacked layers, the end of the part is reflowed to have the desired geometry and the conductive path(s) on the end of the part are allowed to continue across or through the corresponding taper formed on the end of the part.

After the aggregate Z-directed component has been formed, a firing process is applied to solidify the part if it has not been done so already. The firing process also shrinks the part to its final dimensions. At this point, the Z-directed component can be tested for yield and performance and any additional processes may be performed as desired. For example, in some instances, the pressing and heating steps may cause burrs to form. Accordingly, in some embodiments, the Z-directed components are tumbled with various abrasive agents to smooth the corners and edges of the part. Further, resist areas may be added to the Z-directed component to keep the conductive materials from sticking to areas that are not intended to be conductive. Glue areas may be applied to the component to assist with retaining it in the PCB. Visible markings and/or locating features may be added to the Z-directed component to assist with assembly into the PCB.

Once production of the Z-directed component is complete, it is ready to be inserted into the mounting hole of the PCB. As discussed above, the component may be mounted normal to the plane of the PCB from the top or bottom surfaces or both surfaces, mounted at an angle thereto or inserted into the edge of the PCB between the top and bottom surfaces of the PCB. In some embodiments, the Z-directed component is press fit into the mounting hole. This press fit may be in the form of an interference fit between the component and the mounting hole. After the Z-directed component is positioned in the mounting hole, a conductive plating bridge may be applied to connect one or more traces on the top and/or bottom surface of the component to a corresponding trace on the PCB. Further, where the Z-directed component includes side channels therein, such as side channels 732b, 732c, additional conductive plating may be applied to these side channels to form the desired signal connections between the Z-directed component and the PCB.

Figure 25:
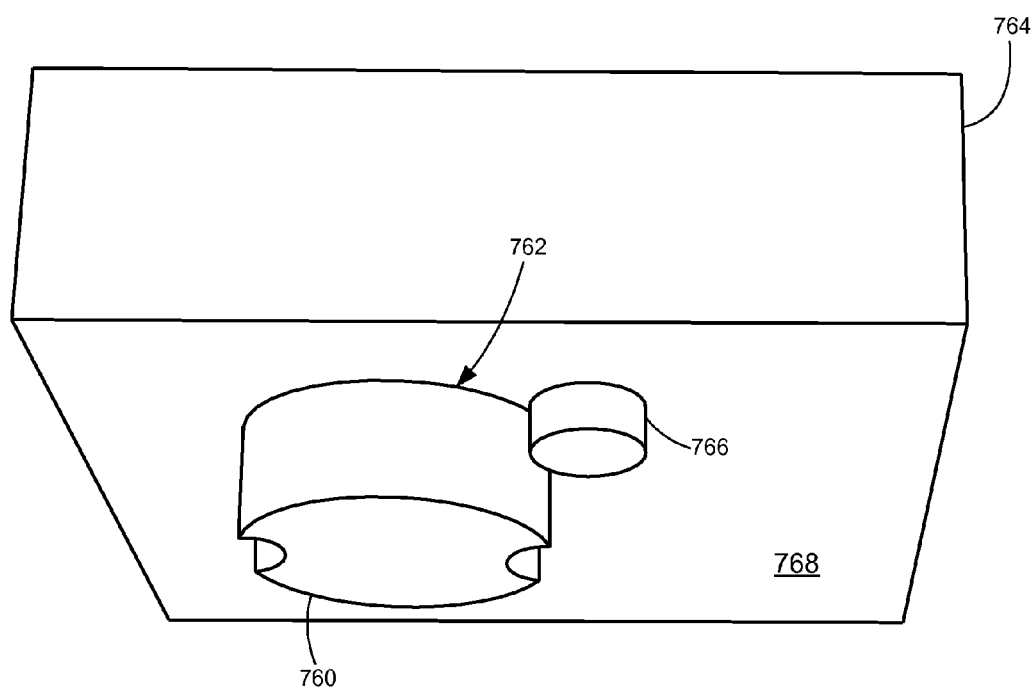
FIG. 25 is a perspective view of a bottom surface of a PCB having an adhesive applied thereto in contact with a side surface of a Z-directed component inserted into a mounting hole in the PCB according to one example embodiment.

With reference to FIG. 25, in one embodiment, after a Z-directed component 760 is inserted into a mounting hole 762 in a PCB 764, an adhesive 766 is applied to a surface 768 of PCB 764 external to mounting hole 762. Adhesive 766 is positioned to contact a surface of Z-directed component 760 when it is inserted into mounting hole 762 in order to fix the location of Z-directed component 760 and prevent it from rotating or translating out of position.

Figure 26A:
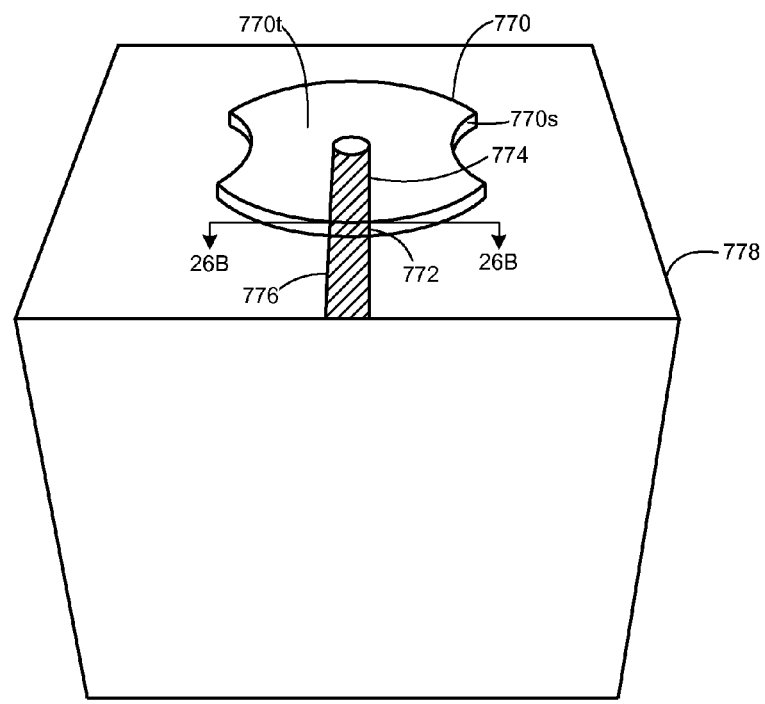
FIG. 26A is a perspective view of a Z-directed component inserted into a mounting hole in a PCB, the Z-directed component having a conductive strip applied to a side surface thereof according to one example embodiment.
Figure 26B:
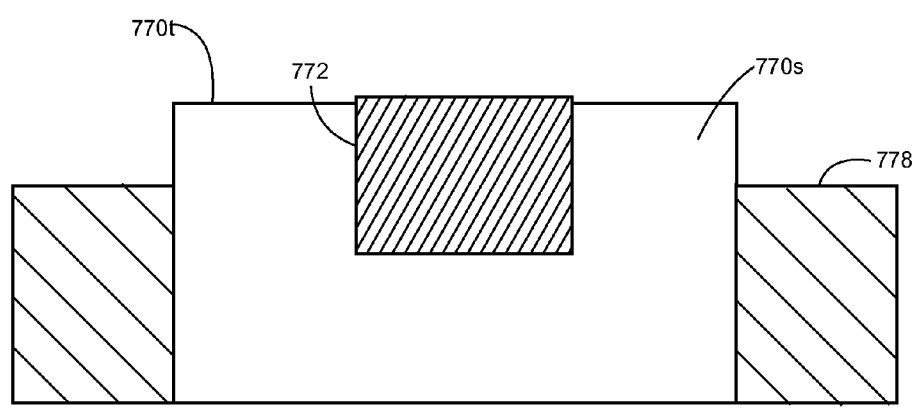
FIG. 26B is a side cutaway view of the Z-directed component and PCB shown in FIG. 26A.

With reference to FIGS. 26A and 26B, manufacturing variations in the thickness of the PCB and the length of the Z-directed component may prevent the Z-directed component from being perfectly flush with both the top and bottom surfaces of the PCB. As a result, in one embodiment, a conductive strip 772 is formed along a side surface 770s of a Z-directed component 770. Conductive strip 772 runs along side surface 770s to either the top or bottom surface of Z-directed component 770. It will be appreciated that conductive strip 772 may be applied after the Z-directed component 770 is formed. Alternatively, conductive strip 772 may be formed during fabrication of Z-directed component 770 such as by applying conductive material to a predetermined portion of the component layer(s) 730 as discussed above. In the example embodiment illustrated, conductive strip 772 runs along side surface 770s to a top surface 770t of Z-directed component 770. In this manner, conductive strip 772 forms a bridge between a trace 774 on the respective top or bottom surface of Z-directed component 770 and a trace 776 on a PCB 778 when the top or bottom surface of the Z-directed component extends past the corresponding top or bottom surface of the PCB. As a result, trace 774 on Z-directed component 770 is able to connect to trace 776 on PCB 778 even if the top or bottom surface of Z-directed component 770 is not flush with the corresponding top or bottom surface of PCB 778. In the example configuration illustrated in FIG. 26B, conductive strip 772 runs from top surface 770t of Z-directed component 770 to a point along side surface 770s that is below the top surface of the PCB 778. In one embodiment, conductive strip 772 extends into the side of Z-directed component 770 both to decrease its resistance and to ensure that it is not removed if another feature such as a taper is later applied to Z-directed component 770.

The foregoing description of several embodiments has been presented for purposes of illustration. It is not intended to be exhaustive or to limit the application to the precise forms disclosed, and obviously many modifications and variations are possible in light of the above teaching. It is understood that the invention may be practiced in ways other than as specifically set forth herein without departing from the scope of the invention. It is intended that the scope of the application be defined by the claims appended hereto.

What is claimed is:

1. A method for manufacturing a z-directed component for insertion into a mounting hole in a printed circuit board, comprising:
    depositing a liquid based material onto a top surface of a rotatable plate, the top surface of the rotatable plate having at least one cavity formed thereon defining the shape of a layer of the z-directed component;
    spinning the rotatable plate to level a top surface of the liquid based material in the at least one cavity;
    curing the liquid based material to form the layer of the z-directed component;
    applying a conductive material to at least one surface of the formed layer;
    forming the z-directed component, the z-directed component including a stack of component layers that includes the formed layer,
    wherein applying the conductive material to the at least one surface of the formed layer includes:
        positioning the formed layer in a constraining plate having a side wall surface that is spaced from a side wall channel in the formed layer forming a gap therebetween; and
        applying conductive material in the gap formed between the side wall surface of the constraining plate and the side wall channel in the formed layer to plate the side wall channel in the formed layer with the conductive material.

2. The method of claim 1, further comprising placing a physical mask on the top surface of the rotatable plate to form the cavity thereof.

3. The method of claim 1, further comprising forming a photoresist layer on the top surface of the rotatable plate to form the cavity thereof.

4. The method of claim 1, wherein the cavity is recessed in the top surface of the rotatable plate.

5. The method of claim 1, wherein applying the conductive material to the at least one surface of the formed layer includes:
    applying a mask to a top surface of the formed layer that restricts the application of conductive material to selected portions of the formed layer; and
    screening conductive material through the mask onto the formed layer.

6. The method of claim 5, wherein the mask includes a physical mask placed on the top surface of the formed layer.

7. The method of claim 5, wherein the mask includes a photoresist layer applied to and developed on the top surface of the formed layer.

8. The method of claim 7, wherein screening conductive material through the mask onto the formed layer includes spin coating liquid conductive material on top of the photoresist layer.

9. The method of claim 1, wherein applying the conductive material to the at least one surface of the formed layer includes spin coating a top surface of the formed layer with liquid conductive material and then selectively etching conductive material from the top surface of the formed layer.

10. The method of claim 1, wherein applying the conductive material to the at least one surface of the formed layer includes selectively jetting the conductive material onto the formed layer.

11. The method of claim 1, wherein applying the conductive material to the at least one surface of the formed layer includes applying a seed layer of conductive material onto a predetermined portion of the formed layer and then applying additional conductive material by an electrolysis technique.

12. The method of claim 1, wherein forming the z-directed component includes heating and compressing a stack of component layers to form an aggregate part.

13. The method of claim 1, wherein a bottom portion of the cavity includes a tapered rim around a periphery thereof that forms a corresponding taper in a bottom surface of the layer.

14. The method of claim 1, further comprising:
   inserting the z-directed component into the mounting hole in the printed circuit board; and
   applying an adhesive to a surface of the printed circuit board external to the mounting hole, the adhesive contacting a surface of the z-directed component when the z-directed component is inserted into the mounting hole to prevent rotational and translational movement of the z-directed component relative to the printed circuit board after insertion.

15. The method of claim 1, further comprising forming a strip of conductive material along a side surface of the formed z-directed component that connects to one of a top surface and a bottom surface of the z-directed component to form a conductive bridge between the respective top or bottom surface of the z-directed component and a trace on the printed circuit board.

16. A method for manufacturing a z-directed component for insertion into a mounting hole in a printed circuit board, comprising:
   depositing a liquid based material onto a top surface of a rotatable plate, the rotatable plate having a first cavity portion formed thereon defining the shape of a first layer of the z-directed component;
   spinning the rotatable plate to level a top surface of the liquid based material in the first cavity portion;
   curing the liquid based material to form the first layer of the z-directed component;
   applying a conductive material to at least one surface of the first formed layer;
   forming a second cavity portion on top of the first cavity portion defining the shape of a second layer of the z-directed component and depositing additional liquid based material onto the top surface of the rotatable plate;
   spinning the rotatable plate to level a top surface of the liquid based material in the second cavity portion;
   curing the liquid based material to form the second layer of the z-directed component stacked on top of the first layer; and
   forming the z-directed component, the z-directed component including a stack of component layers that includes the first and second layers,
   wherein the first cavity portion is formed in a first plate and the second cavity portion is formed in a second plate, the second plate being stacked on top of the first plate so that the second layer of the z-directed component is formed stacked on top of the first layer.

17. A method for manufacturing a z-directed component for insertion into a mounting hole in a printed circuit board, comprising:
   depositing a liquid based material onto a top surface of a rotatable plate, the rotatable plate having a first cavity portion formed thereon defining the shape of a first layer of the z-directed component;
   spinning the rotatable plate to level a top surface of the liquid based material in the first cavity portion;
   curing the liquid based material to form the first layer of the z-directed component;
   applying a conductive material to at least one surface of the first formed layer;
   forming a second cavity portion on top of the first cavity portion defining the shape of a second layer of the z-directed component and depositing additional liquid based material onto the top surface of the rotatable plate;
   spinning the rotatable plate to level a top surface of the liquid based material in the second cavity portion;
   curing the liquid based material to form the second layer of the z-directed component stacked on top of the first layer; and
   forming the z-directed component, the z-directed component including a stack of component layers that includes the first and second layers,
   wherein the first cavity portion is formed in a cavity in the rotatable plate, the bottom surface of the first cavity portion is formed by a raisable elevator therein, and the second cavity portion is formed by lowering the elevator to create additional space in the cavity in the rotatable plate after the first layer of the z-directed component is formed so that the second layer of the z-directed component is formed stacked on top of the first layer.

* * * * *